US012751075B2

(12) United States Patent
Cheng et al.

(10) Patent No.: US 12,751,075 B2
(45) Date of Patent: Sep. 29, 2026

(54) ISOLATION FEATURES FOR SEMICONDUCTOR DEVICES AND METHODS OF FABRICATING THE SAME

(71) Applicant: Taiwan Semiconductor Manufacturing Company, Ltd., Hsin-Chu (TW)

(72) Inventors: Kuan-Hao Cheng, Hsinchu (TW); Chia-Pin Lin, Hsinchu County (TW); Wei-Yang Lee, Taipei City (TW); Tzu-Hua Chiu, Hsinchu (TW); Wei-Han Fan, Hsin-Chu City (TW); Po-Yu Lin, New Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1143 days.

(21) Appl. No.: 17/752,577

(22) Filed: May 24, 2022

(65) Prior Publication Data

US 2023/0019386 A1 Jan. 19, 2023

Related U.S. Application Data

(60) Provisional application No. 63/222,771, filed on Jul. 16, 2021.

(51) Int. Cl.
*H10D 84/01* (2026.01)
*H10D 30/01* (2025.01)
(Continued)

(52) U.S. Cl.
CPC ......... *H10D 84/038* (2025.01); *H10D 30/031* (2025.01); *H10D 30/6735* (2025.01);
(Continued)

(58) Field of Classification Search
CPC .......... H01L 21/76232; H01L 21/0259; H10D 84/0177; H10D 84/0188; H10D 30/031;
(Continued)

(56) References Cited

U.S. PATENT DOCUMENTS

| | | | | |
|---|---|---|---|---|
| 9,620,503 | B1 * | 4/2017 | Liao | H10D 30/797 |
| 11,088,022 | B2 | 8/2021 | Tsai et al. | |

(Continued)

FOREIGN PATENT DOCUMENTS

| | | | |
|---|---|---|---|
| TW | 201539762 | A | 10/2015 |
| TW | 202046500 | A | 12/2020 |

(Continued)

OTHER PUBLICATIONS

Pei-Ling Kao, "Multi-Gate Transistor Channel Height Adjustment", U.S. Appl. No. 17/736,454, Assignee Taiwan Semiconductor Manufacturing Company, Ltd., 29 Pages of Specification, 32 pages of drawings.

(Continued)

*Primary Examiner* — Bradley Smith
(74) *Attorney, Agent, or Firm* — HAYNES AND BOONE, LLP

(57) ABSTRACT

Semiconductor devices and methods are provided. In an embodiment, a semiconductor device includes first nanostructures directly over a first portion of a substrate and second nanostructures directly over a second portion of the substrate, n-type source/drain features coupled to the first nanostructures and p-type source/drain features coupled to the second nanostructures, and an isolation structure disposed between the first portion of the substrate and the second portion of the substrate. The isolation structure includes a first smiling region in direct contact with the first portion of the substrate and having a first height. The isolation structure also includes a second smiling region in
(Continued)

direct contact with the second portion of the substrate and having a second height, the first height is greater than the second height.

20 Claims, 19 Drawing Sheets

(51) Int. Cl.
*H10D 30/67* (2025.01)
*H10D 62/10* (2025.01)
*H10D 84/03* (2025.01)
*H10D 84/85* (2025.01)
*H10P 14/20* (2026.01)
*H10W 10/00* (2026.01)
*H10W 10/17* (2026.01)

(52) U.S. Cl.
CPC ....... *H10D 30/6757* (2025.01); *H10D 62/118* (2025.01); *H10D 84/0167* (2025.01); *H10D 84/017* (2025.01); *H10D 84/0177* (2025.01); *H10D 84/0188* (2025.01); *H10D 84/85* (2025.01); *H10P 14/3452* (2026.01); *H10W 10/0145* (2026.01); *H10W 10/17* (2026.01)

(58) Field of Classification Search
CPC ............... H10D 84/017; H10D 62/118; H10D 30/6757; H10D 84/85; H10D 84/038
See application file for complete search history.

(56) References Cited

U.S. PATENT DOCUMENTS

| | | | | |
|---|---|---|---|---|
| 2018/0151414 | A1* | 5/2018 | Wu | H10D 84/038 |
| 2020/0111798 | A1* | 4/2020 | Paul | H10B 10/125 |

FOREIGN PATENT DOCUMENTS

| | | | |
|---|---|---|---|
| TW | 202117859 | A | 5/2021 |
| TW | 202121538 | A | 6/2021 |
| TW | 202123324 | A | 6/2021 |

OTHER PUBLICATIONS

Chih-Chuan Yang "Source/Drain Feature for Multigate Device Performance and Method of Fabricating Thereof" U.S. Appl. No. 17/552,111, Assignee Taiwan Semiconductor Manufacturing Company, Ltd., 26 pages of Specification, 8 pages of drawings.

Wei-Lun Min "Semiconductor Structure with Recessed Top Semiconductor Layer in Substrate and Method of Fabricating the Same" U.S. Appl. No. 17/461,500; Assignee Taiwan Semiconductor Manufacturing Company, Ltd., 23 Pages of Specification, 15 Pages of Drawings.

* cited by examiner

ISOLATION FEATURES FOR SEMICONDUCTOR DEVICES AND METHODS OF FABRICATING THE SAME

PRIORITY

This application claims the priority to U.S. Provisional Application Ser. No. 63/222,771, filed Jul. 16, 2021, entitled "Semiconductor Structures and Methods of Fabricating Thereof," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistors (multi-gate MOSFETs, or multi-gate devices) have been introduced to improve gate control by increasing gate-channel coupling, reducing off-state current, and reducing short-channel effects (SCEs). A multi-gate device generally refers to a device having a gate structure, or a portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. While existing MBC transistor structures are generally adequate for their general purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
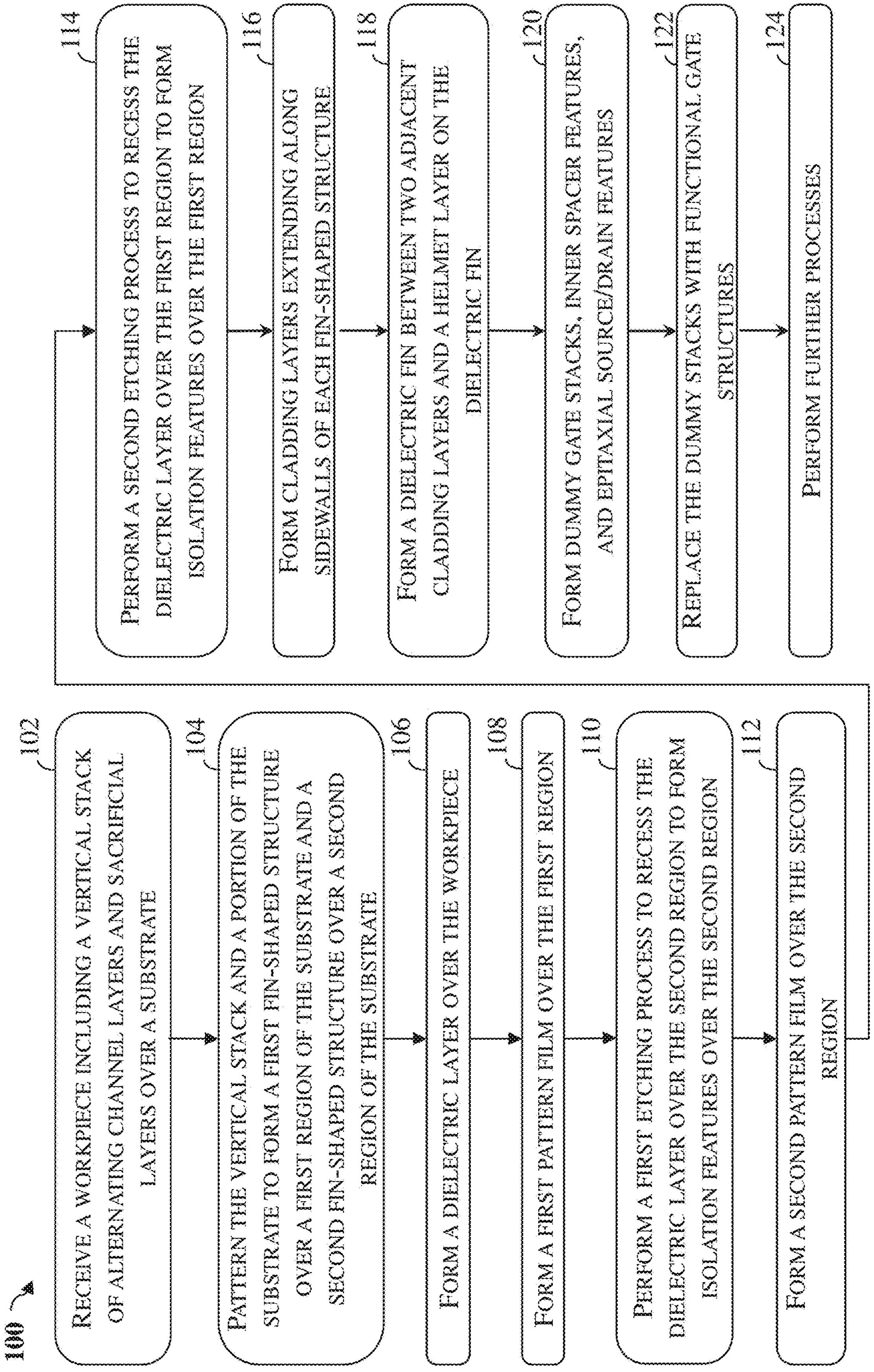
FIG. 1 illustrates a flowchart of an exemplary method for fabricating a semiconductor structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Formation of an MBC transistor includes formation of a stack that includes a number of channel layers interleaved by a number of sacrificial layers over a substrate, where the sacrificial layers may be selectively removed to release the channel layers as channel members. The stack and a portion of the substrate are patterned to form active regions. A gate structure that includes a dielectric layer and a conductive layer is then formed to wrap around and over each of the channel members. However, in some instances, MBC transistors may suffer current leakage near the patterned portion of the substrate (i.e., mesa structure). More specifically, n-type MBC transistors may be formed in and over a p-type well (e.g., boron-doped p well) in the substrate, p-type MBC transistors may be formed in and over an n-type well (e.g., phosphorous-doped n well) in the substrate. Due to the implementation of some thermal processes (e.g., annealing) in the formation of the n-type MBC transistors and p-type MBC transistors, dopants (e.g., phosphorous) in the n-type well of the p-type MBC transistors may diffuse into the p-type well of the n-type MBC transistors, reducing the dopant concentration in the p-type well of the n-type MBC transistors, thereby increasing the junction leakage and degrading the carrier mobility in the n-type MBC transistors. As device spacing (such as between an n-type field effect transistor (FET) and a p-type FET) becomes smaller, the undesired diffusion may be more severe. Also, different from the other channel members, the bottommost channel member formed from the mesa structure is not wrapped around by the gate structure. The insufficient gate control over the bottommost channel member increases the current leakage, resulting in poor device performance.

The present disclosure provides semiconductor devices with reduced current leakage and methods for forming the same. In an embodiment, a semiconductor device includes first nanostructures directly over a first portion of a substrate and second nanostructures directly over a second portion of the substrate, n-type source/drain features coupled to the first nanostructures and p-type source/drain features coupled to the second nanostructures, and an isolation structure disposed between the first portion of the substrate and the second portion of the substrate. The isolation structure includes a first smiling region in direct contact with the first portion of the substrate and having a first height, a second smiling region in direct contact with the second portion of the substrate and having a second height, the first height is greater than the second height.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2-19, which are fragmentary top views or cross-sectional views of a workpiece 200 at fabrication stages according to embodiments of method 100. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires. For avoidance of doubts, the X, Y and Z directions in FIGS. 2-19 are perpendicular to one another and are used consistently throughout FIGS. 2-19. Throughout the present disclosure, like reference numerals denote like features unless otherwise excepted.

Figure 2:
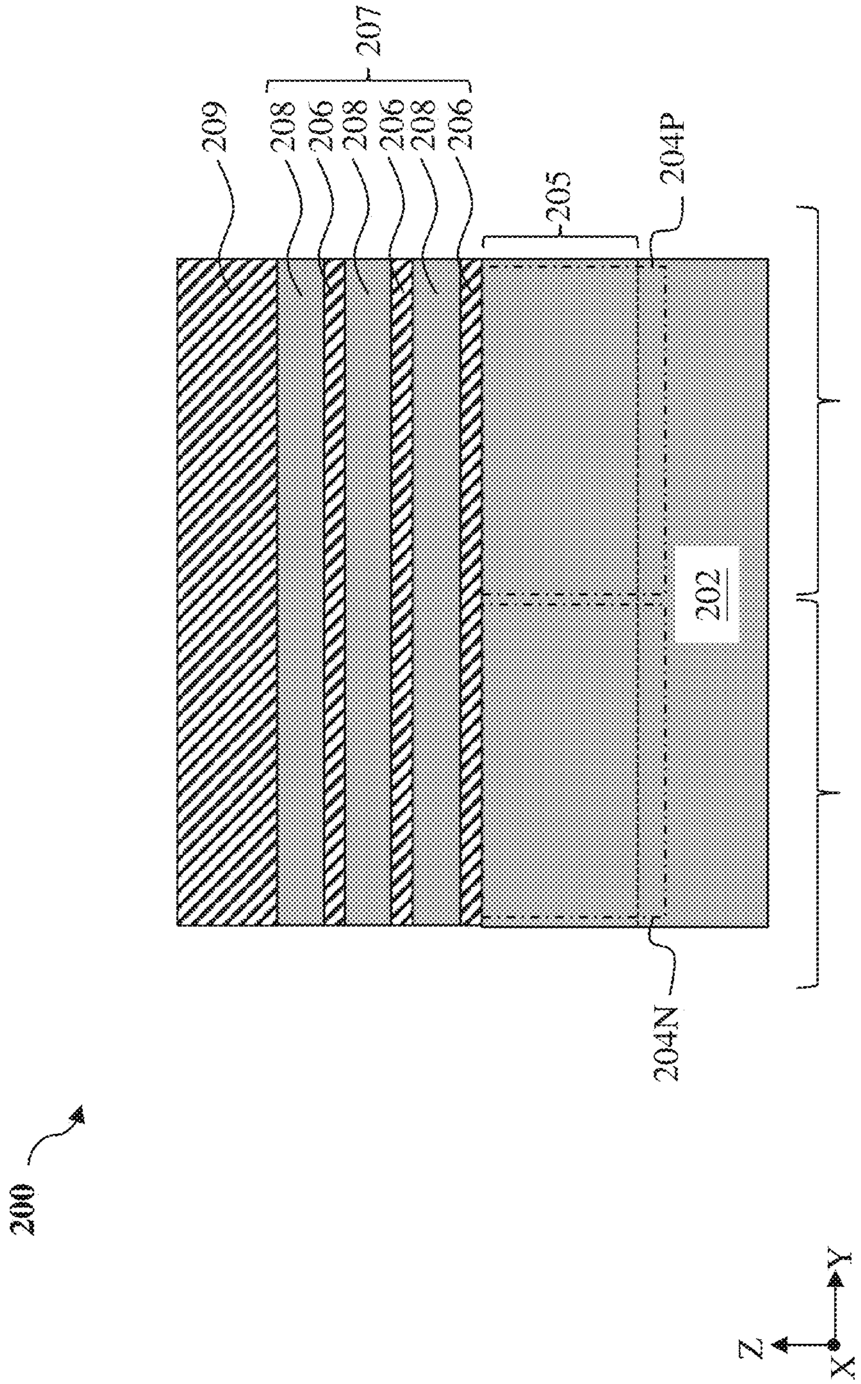
FIGS. 2, 3, 4, 5, 6, 7, 8, 9, 10, 11, 12, 13, 14, 15, 16, 17, 18, and 19 illustrate fragmentary cross-sectional views and/or top view of an exemplary workpiece during various fabrication stages in the method of FIG. 1, according to one or more aspects of the present disclosure.

Referring to FIGS. 1 and 2, method 100 includes a block 102 where a workpiece 200 is received. The workpiece 200 includes a substrate 202. In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate, and includes a carrier, an insulator on the carrier, and a semiconductor layer on the insulator. The substrate 202 can include various doped regions configured according to design requirements of semiconductor device 200. P-type doped regions may include p-type dopants, such as boron (B), boron difluoride ($BF_2$), other p-type dopant, or combinations thereof. N-type doped regions may include n-type dopants, such as phosphorus (P), arsenic (As), other n-type dopant, or combinations thereof. The various doped regions can be formed directly on and/or in substrate 202, for example, providing a p-well structure, an n-well structure, or combinations thereof. An ion implantation process, a diffusion process, and/or other suitable doping process can be performed to form the various doped regions. Referring to FIG. 2, the workpiece 200 includes a first region 200N for formation of n-type MBC transistors and a second region 200P for formation of p-type MBC transistors. The substrate 202 includes a p-type well 204P in the first region 200N and an n-type well 204N (e.g., doped with phosphorus) in the second region 200P.

Still referring to FIG. 2, the workpiece 200 includes a vertical stack 207 of alternating semiconductor layers disposed over the substrate 202 and in the first region 200N and the second region 200P. In an embodiment, the vertical stack 207 includes a number of channel layers 208 interleaved by a number of sacrificial layers 206. Each channel layer 208 may include a semiconductor material such as, silicon, germanium, silicon carbide, silicon germanium, GeSn, SiGeSn, SiGeCSn, other suitable semiconductor materials, or combinations thereof, while each sacrificial layer 206 has a composition different from that of the channel layer 208. In an embodiment, the channel layer 208 includes silicon (Si), the sacrificial layer 206 includes silicon germanium (SiGe). It is noted that three layers of the sacrificial layers 206 and three layers of the channel layers 208 are alternately and vertically arranged as illustrated in FIG. 2, which are for illustrative purposes only and not intended to limit the present disclosure to what is explicitly illustrated therein. It is understood that any number of sacrificial layers 206 and channel layers 208 can be formed in the stack 207. The number of layers depends on the desired number of channels members for the semiconductor device 200. In some embodiments, the number of the channel layers 208 is between 2 and 10.

Still referring to FIG. 2, the workpiece 200 also includes a hard mask layer 209 formed over the vertical stack 207. In the present embodiments, the hard mask layer 209 is a sacrificial layer configured to facilitate the formation of a helmet layer (e.g., helmet layer 232 shown in FIG. 14) that is used to cut a gate structure into isolated segments. As such, a thickness of the hard mask layer 209 may be adjusted based on the desired thickness of the helmet layer. In some embodiments, the thickness of the hard mask layer 209 is greater than a thickness of the sacrificial layer 206. The hard mask layer 209 may include any suitable materials, such as a semiconductor material, so long as its composition is different from that of the channel layer 208 and the to-be-formed dielectric fin (e.g., dielectric fin 230 shown in FIG. 14) to allow selective removal by an etching process. In some embodiments, the hard mask layer 209 has a composition similar to or the same as that of the sacrificial layer 206 and includes, for example, SiGe.

Figure 3:
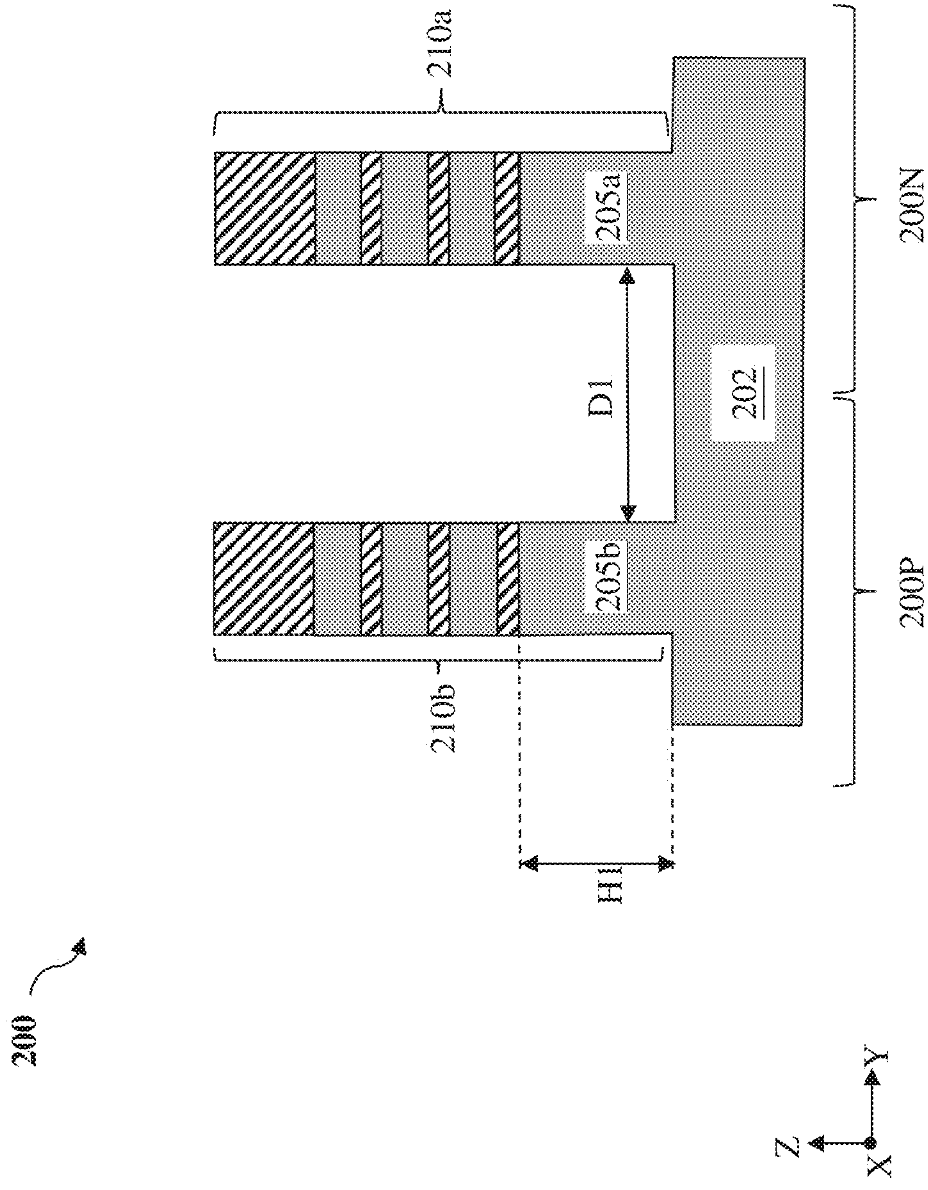
Figure 4:
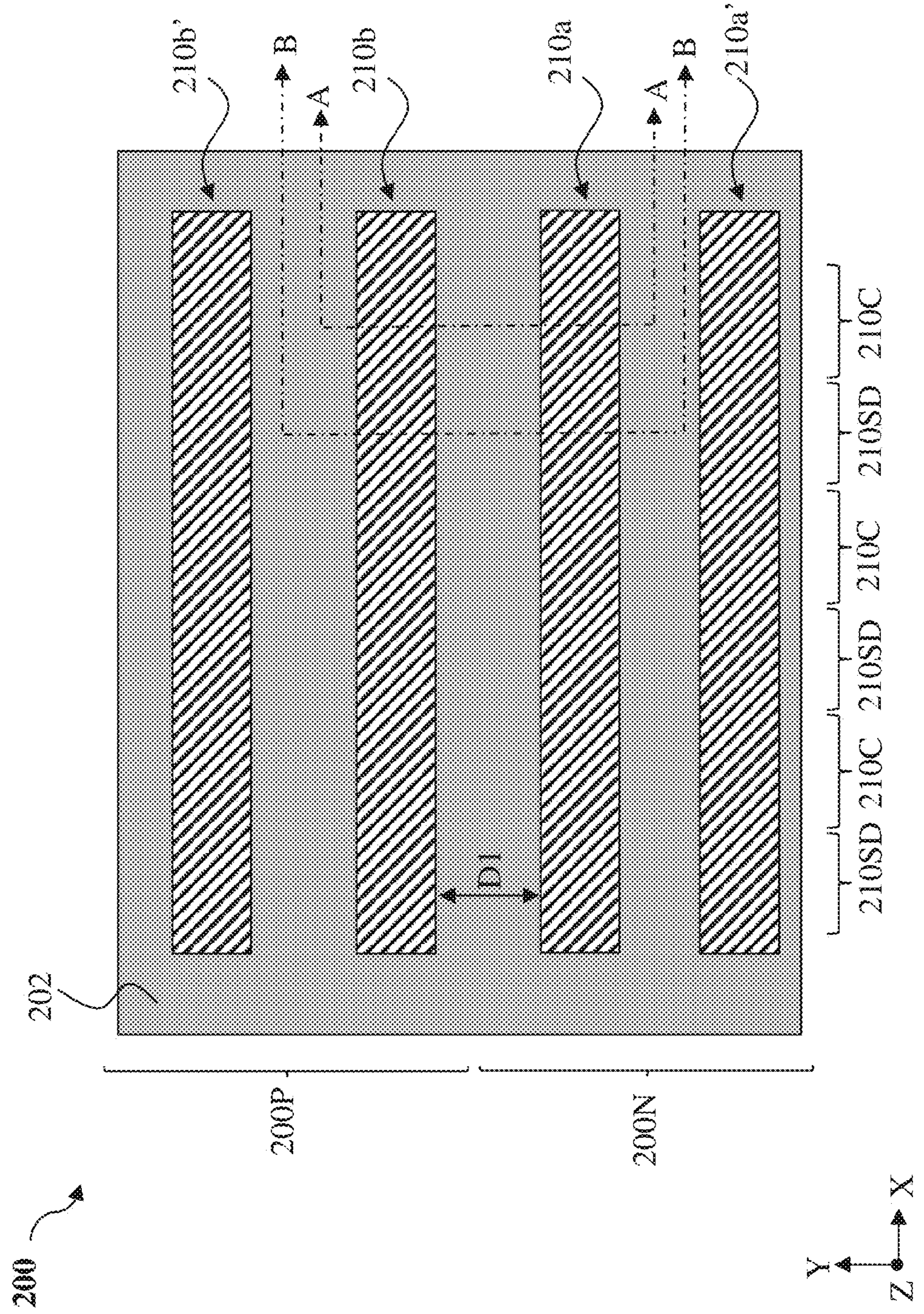

Referring to FIGS. 1 and 3-4, method 100 includes a block 104 where the hard mask layer 209, the vertical stack 207, and a portion 205 of the substrate 202 are patterned to form a fin-shaped structure 210*a* in the first region 200N and a fin-shaped structure 210*b* in the second region 200P. The patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. After the patterning, each of the fin-shaped structures 210*a*-210*b* includes a patterned hard mask layer 209, a patterned vertical stack 207, and a patterned portion 205 of the substrate 202. The patterned portion 205 of the substrate 202 in the first region 200N is referred to as a mesa structure 205*a*, and the patterned portion 205 of the substrate 202 in the second region 200P is referred to as a mesa structure 205*b*. The mesa structures 205*a*-205*b* each may have a height H1 along the Z direction. In an embodiment, the height H1 may be between about 5 nm and about 50 nm to facilitate the formation of a satisfactory isolation feature between the fin-shaped structure 210*a* and the fin-shaped structure 210*b*. A distance between the fin-shaped structure 210*a* and the fin-shaped structure 210*b* may be referred to as D1. In an embodiment, the distance D1 may be between about 5 nm and about 50 nm to form transistors with a desired density and satisfactory isolation.

FIG. 4 depicts a top view of the exemplary workpiece 200 shown in FIG. 3. As shown in FIG. 4, each of the fin-shaped structures 210*a*-210*a*' and 210*b*-210*b*' extends lengthwise along the X direction and includes channel regions 210C and source/drain regions 210SD. Source/drain region(s) may refer to a source or a drain, individually or collectively dependent upon the context. The fin-shaped structure 210*a*' is in a way similar to the fin-shaped structure 210*a*, and the fin-shaped structure 210*b*' is in a way similar to the fin-shaped structure 210*b*. Each channel region 210C is disposed between two source/drain regions 210SD. FIGS. 5-16 and FIGS. 18-19 depict cross-sectional views of the workpiece 200 taken along line A-A shown in FIG. 4 during various fabrication stages in the method 100 and FIG. 17 depicts a cross-sectional view of the workpiece 200 taken along line B-B shown in FIG. 4 during one of the various fabrication stages in the method 100. It is noted that two fin-shaped structures (210*a* and 210*a*') are formed in the first region 200N and two fin-shaped structures (210*b* and 210*b*') are formed in the second region 200P as illustrated in FIG. 4, which are for illustrative purposes only and not intended to limit the present disclosure to what is explicitly illustrated therein.

Figure 5:
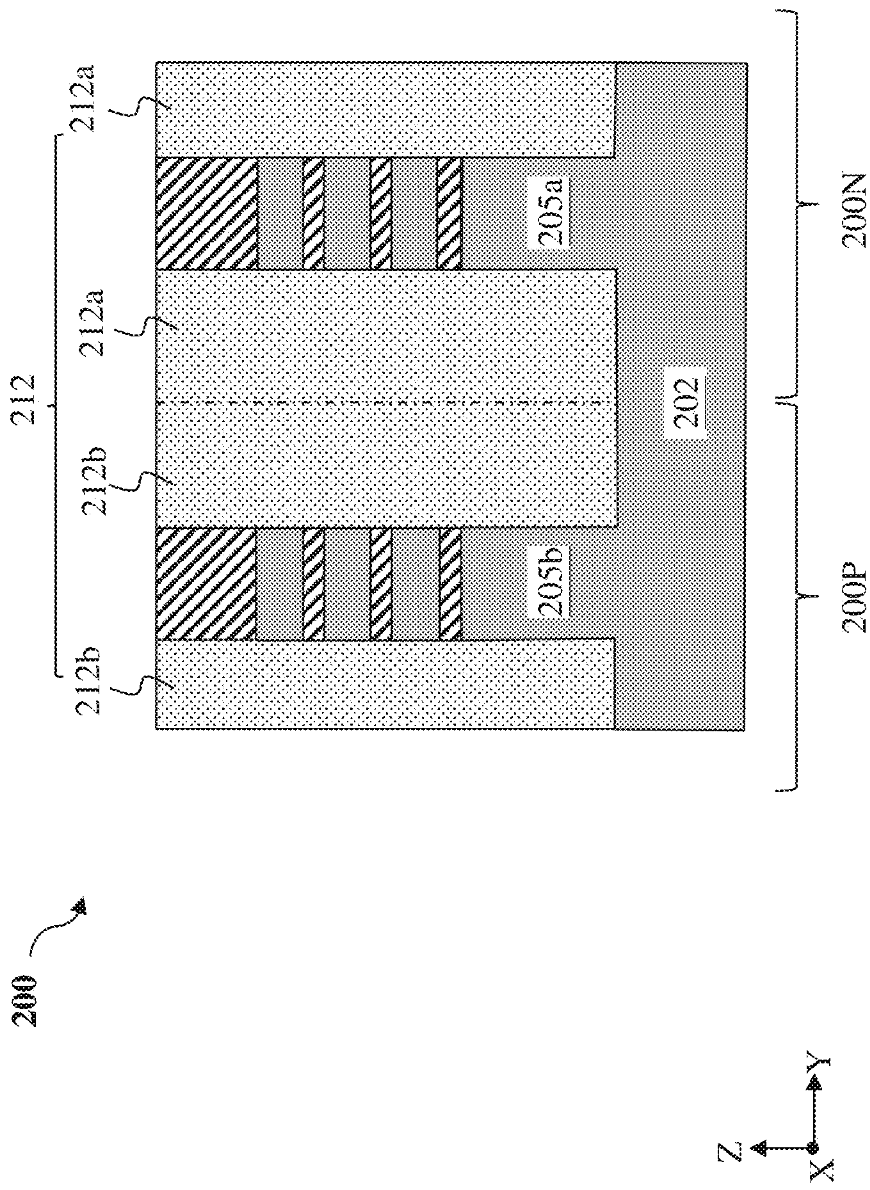

Referring to FIGS. 1 and 5, method 100 includes a block 106 where a dielectric layer 212 is formed over the workpiece 200 to fill trenches between two adjacent fin-shaped structures (such as fin-shaped structures 210*a* and 210*b*). The dielectric layer 212 may include silicon oxide, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The dielectric layer 212 may be deposited over the workpiece 200 by any suitable method, such as CVD, flowable CVD (FCVD), spin-on-glass (SOG), other suitable methods, or combinations thereof. The dielectric layer 212 may include a single-layer structure or a multi-layer structure that has a liner and fill layer on the liner. In this present embodiment, the dielectric layer 212 is a single-layer structure. As shown in FIG. 5, the dielectric layer 212 may subsequently be planarized by a chemical-mechanical planarization/polishing (CMP) process until the top surface of the hard mask layer 209 is exposed. In the present embodiments, a portion of the dielectric layer 212 that is formed in the first region 200N may be referred to as dielectric layer 212*a*, and a portion of the dielectric layer 212 that is formed in the second region 200P may be referred to as dielectric layer 212*b*. Although there is a dashed line in FIG. 5 showing the boundary between the first region 200N and second region 200P, it is understood that there is no interface between the dielectric layer 212*a* and the dielectric layer 212*b*.

Figure 6:
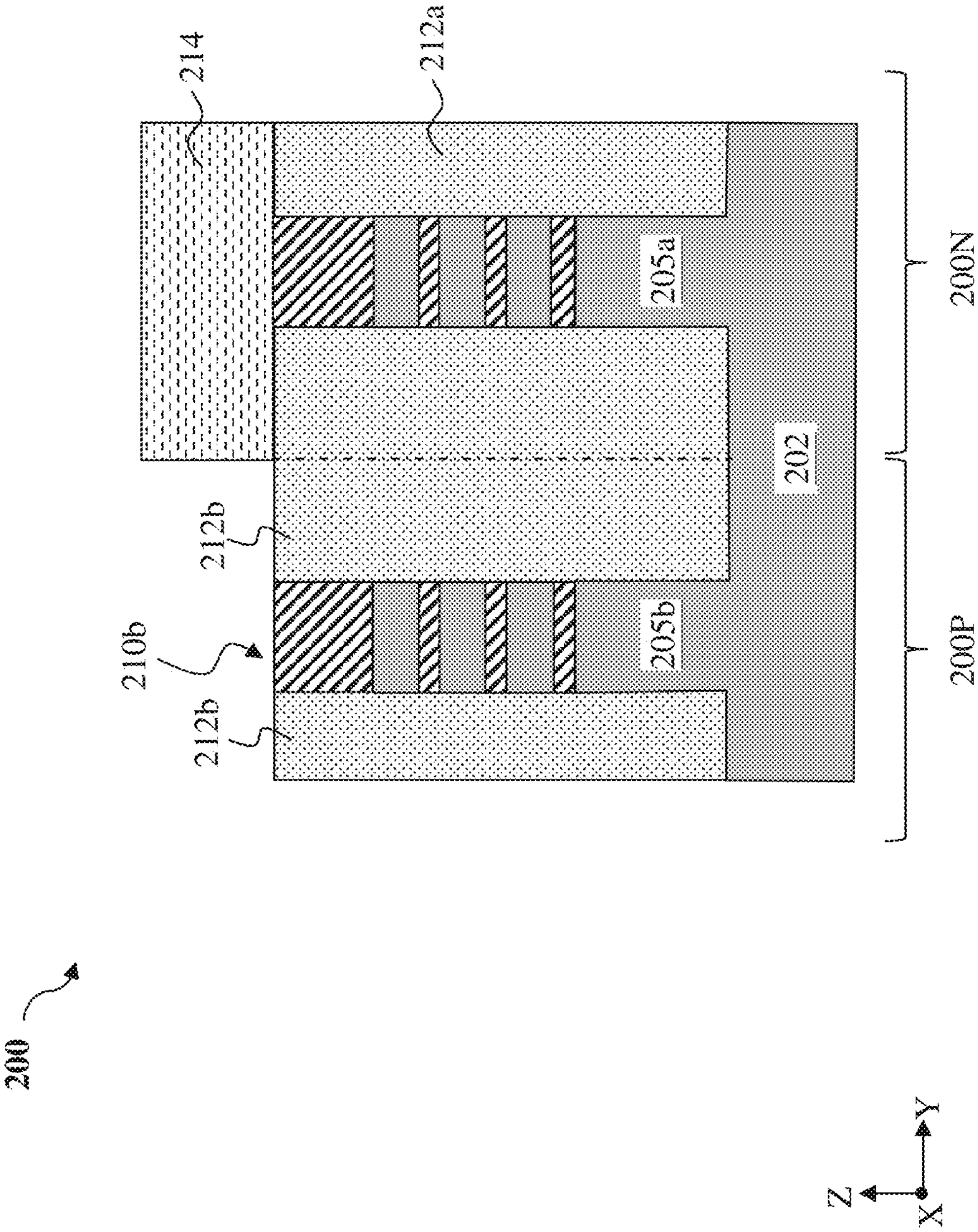

Referring to FIGS. 1 and 6, method 100 includes a block 108 where a first pattern film 214 is formed over the workpiece 200 to cover the first region 200N of the workpiece 200. That is, the first pattern film 214 covers the dielectric layer 212*a* and the fin-shaped structure 210*a* in the first region 200N while exposing the dielectric layer 212*b* and the fin-shaped structure 210*b* in the second region 200P. In some embodiments, a mask film (e.g., a bottom anti-reflective coating (BARC) layer) may be formed over the workpiece 200 using spin-on coating, flowable CVD (FCVD), or other suitable processes and then patterned to form the first pattern film 214. The patterning process may include a lithography process (e.g., photolithography or e-beam lithography) which may include photoresist coating, soft baking, mask aligning, exposure, post-exposure baking, photoresist developing, rinsing, drying, other suitable lithography techniques, and/or combinations thereof. In an embodiment, the first pattern film 214 includes a patterned photoresist layer.

Figure 7:
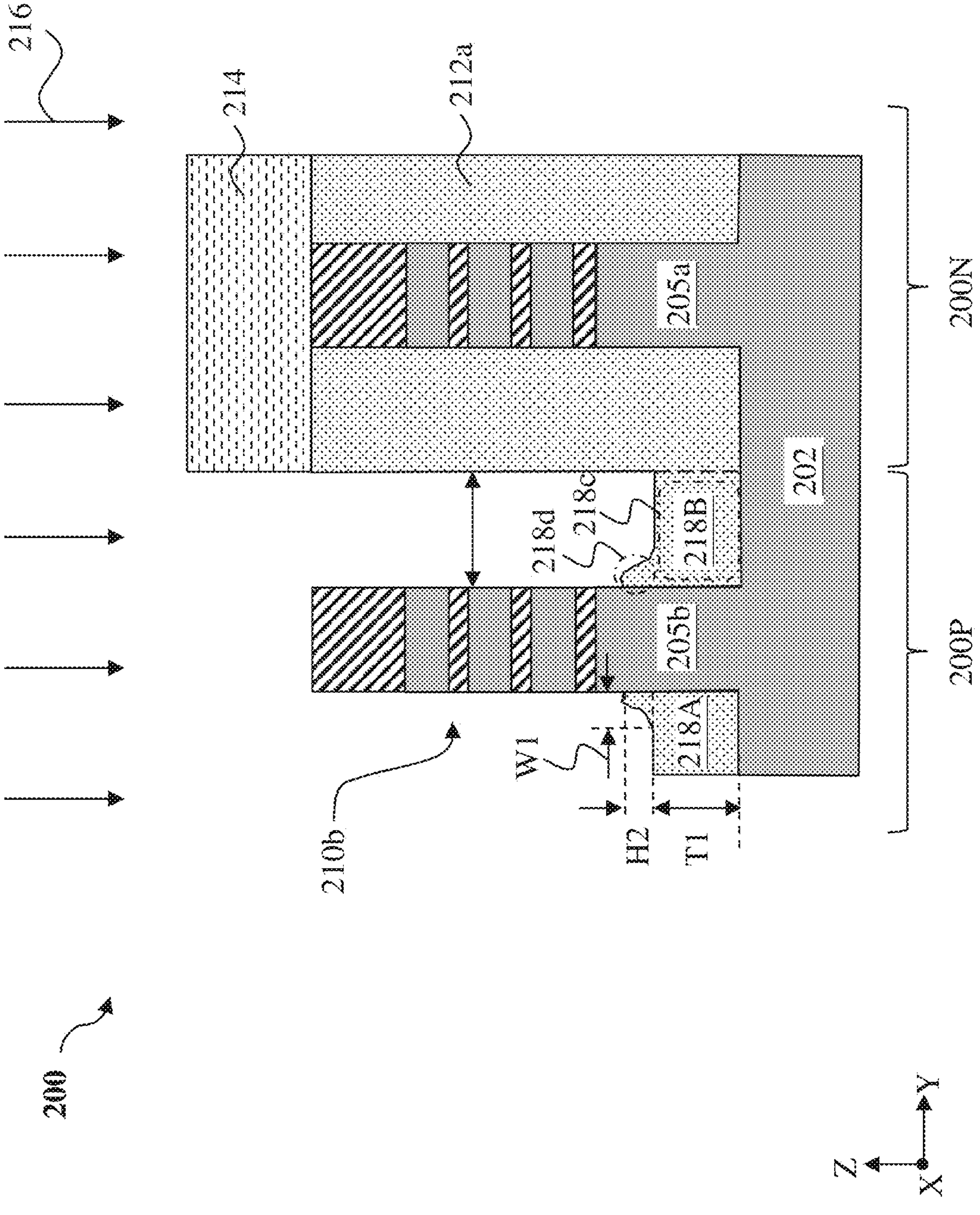

Referring to FIGS. 1 and 7, method 100 includes a block 110 where a first etching process 216 is performed to recess the dielectric layer 212*b* exposed by the first pattern film 214 without substantially etching the fin-shaped structure 210*b* to form isolation features in the second region 200P. The workpiece 200 may be placed in a process chamber and the first etching process 216 may be then conducted while using the first pattern film 214 as an etch mask. The first etching process 216 may be a dry etching process, a wet etching process, or a combination thereof. In an embodiment, the first etching process 216 is a dry etch process that includes use of an oxygen-containing gas, hydrogen, nitrogen, a fluorine-containing gas (e.g., HF, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases (e.g., $NH_3$) and/or plasmas, and/or combinations thereof. In an embodiment, the first etching process 216 implements a combination of HF and $NH_3$. Various parameters, such as pressure, power, temperature, gas flow rate, and/or other suitable parameters of the first etching process 216 may be fine-tuned to form satisfactory isolation structures having satisfactory smiling regions. For example, in an embodiment, the first etching process 216 is performed in a process chamber, and during the first etching process 216, a pressure in the process chamber may be between about 1 Torr and about 100 Torr.

As shown in FIG. 7, after the first etching process 216, isolation structures are formed in the second region 200P. It is noted that, FIG. 7 is a fragmentary cross-sectional view of the workpiece 200 and thus only shows a portion of the workpiece 200. In embodiments represented in FIG. 7, the cross-sectional view of the workpiece 200, an isolation structure 218A is formed on one side of the fin-shaped structure 210*b*, and an isolation structure 218B is formed on the other side of the fin-shaped structure 210*b*. The isolation structure 218A may be substantially symmetric to the isolation structure 218B. Each of the isolation structures 218A and 218B includes a base region 218*c* having a substantially uniform thickness T1 in the Z direction and a smiling region 218*d* protruding from the base region 218*c*. Top surfaces of the isolation structures 218A and 218B expose both the base region 218*c* and the smiling region 218*d*. It is noted that the base region 218*c* and the smiling region 218*d* are formed by performing a common etching process 216 to the dielectric layer 212 and there is no interface between the base region 218*c* and the smiling region 218*d*. The smiling region 218*d* interfaces with the fin-shaped structure 210*b* and a height of the interface may be referred to as height H2. The smiling region 218*d* has a width W1 along the X direction. In an embodiment, a ratio of the height H2 to the width W1 may be between about 0.9 and 1.1. In some embodiments, the height H2 is between about 1 nm and about 3 nm, and the width W1 is between about 1 nm and about 3 nm. In embodiments represented in FIG. 7, a top surface of the smiling region 218*d* is lower than a top surface of the mesa structure 205*b*. That is, sidewalls of the mesa structure 205*b* are not fully covered by the isolation structures 218A and 218B. In some embodiments, the smiling region 210*d* and a portion of the base region 210*c* that is directly under the smiling region 210*d* may be collectively referred to as an edge region of the isolation structure. A rest of the base region 210*c* may be referred to as a central region of the isolation structure. The isolation structures 218A and 218B may include portions of shallow trench isolation (STI) features. It is understood that FIG. 7 is a fragmentary cross-sectional view of the workpiece 200 and the workpiece 200 may also include the fin-shaped structure 210*b*' (shown in FIG. 4) and another isolation structure 218B that extending from the isolation structure 218A and is in direct contact with fin-shaped structure 210*b*'. After the first etching process 216, the first pattern film 214 may be selectively removed.

Figure 8:
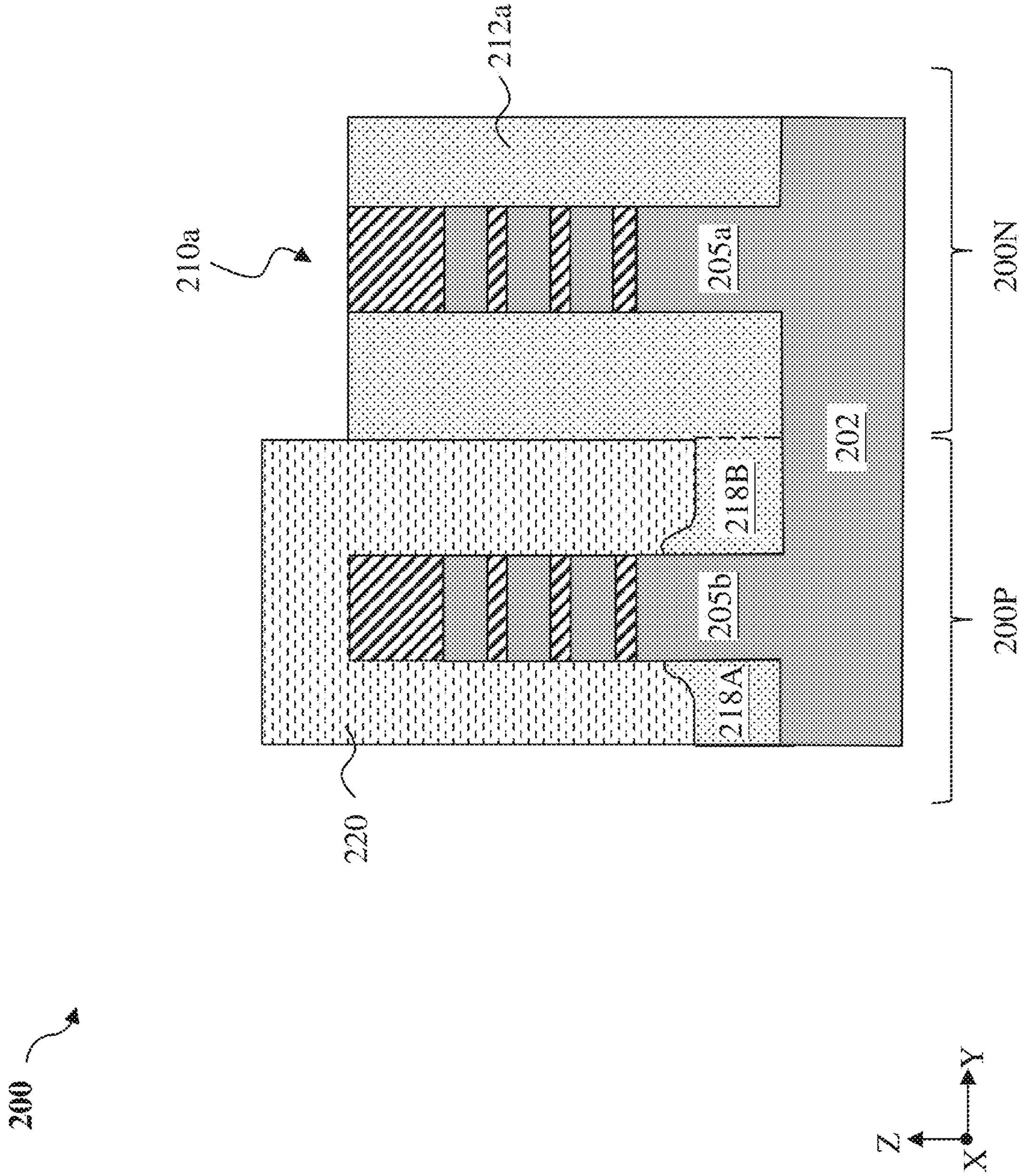

Referring to FIGS. 1 and 8, method 100 includes a block 112 where a second pattern film 220 is formed over the workpiece 200 to cover features in the second region 200P while exposing features in the first region 200N. That is, as illustrated in FIG. 8, the second pattern film 220 is formed directly over the isolation structures 218A-218B and the fin-shaped structure 210*b* in the second region 200P and exposes the dielectric layer 212*a* and the fin-shaped structure 210*a* in the first region 200N. The composition and formation of the second pattern film 220 may be in a way similar to those of the first pattern film 214, and related description is omitted for reason of simplicity.

Referring to FIGS. 1 and 9-11, method 100 includes a block 114 where a second etching process 222 is performed to recess the dielectric layer 212*a* exposed by the second pattern film 220 without substantially etching the fin-shaped structure 210*a* to form isolation features in the first region 200N. The workpiece 200 may be placed in a process chamber and the second etching process 222 may be then conducted while using the second pattern film 220 as an etch mask. The second etching process 222 may be a dry etching process, a wet etching process, or a combination thereof. In an embodiment, the second etching process 222 is a dry etch process that includes use of an oxygen-containing gas, hydrogen, nitrogen, a fluorine-containing gas (e.g., HF, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases (e.g., $NH_3$) and/or plasmas, and/or combinations thereof. In an embodiment, the etchant(s) employed by the second etching process 222 is the same as that of the first etching process 216. For example, both the first etching process 216 and the second etching process 222 implement a combination of HF and $NH_3$. One or more parameters such as etchants, pressure, power, temperature, gas flow rate, and/or other suitable parameters associated with the second etching process 222 may be adjusted to form the isolation structures with satisfactory smiling regions in the first region 200N. In an embodiment, etchant(s) employed in the second etching process 222 may be same to the etchant(s) employed in the first etching process 216, and a pressure in the process chamber during the second etching process 222 is different than (e.g., less than) that of the first etching process 216 such that the second etching process 222 etches the dielectric layer 212*a* at a slower etch rate than that of the first etching process 216 etches the dielectric layer 212*b*. In an embodiment, the pressure of the second etching process 222 may be between about 1 Torr and about 100 Torr.

Figure 9:
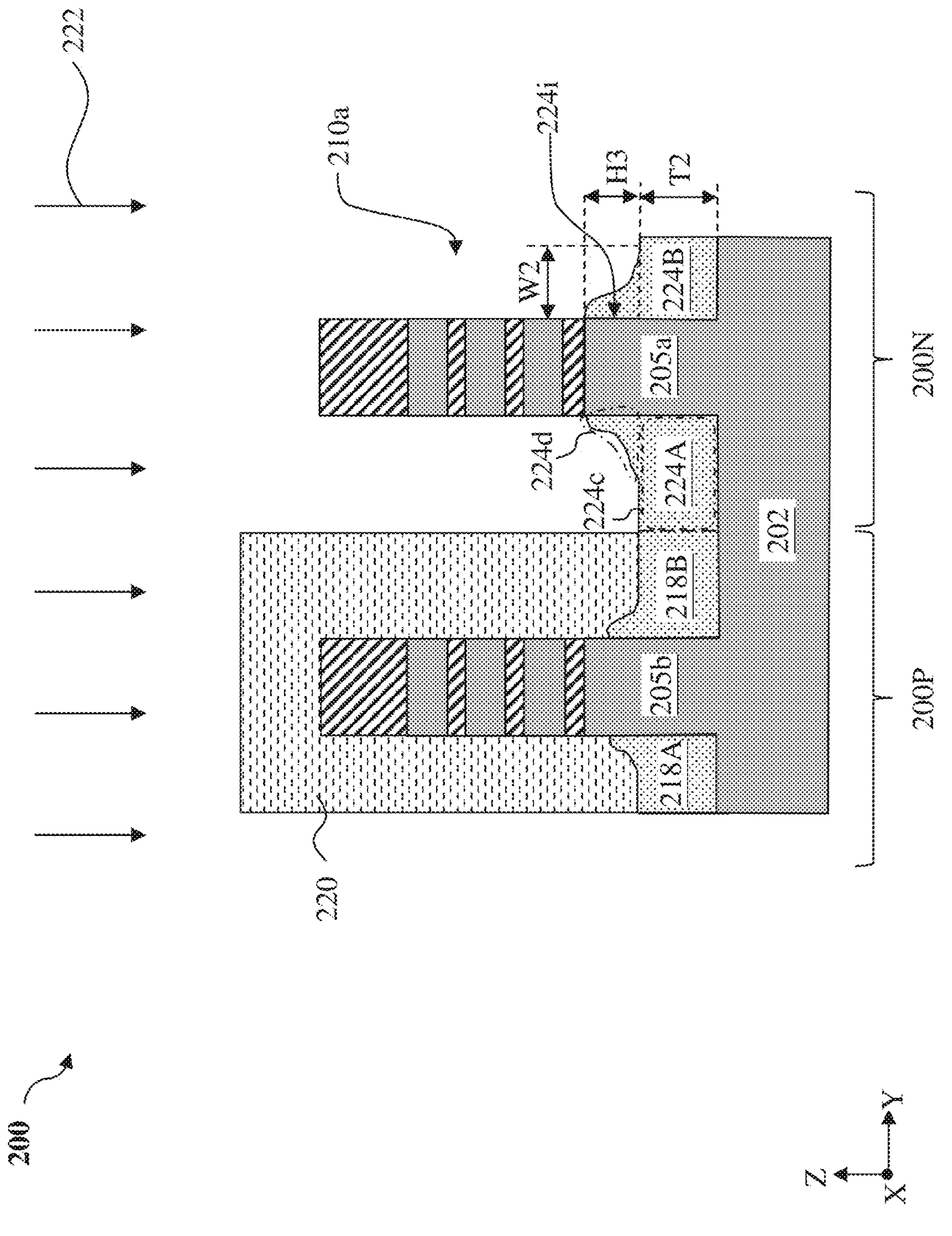

As shown in FIG. 9, after the second etching process 222, isolation structures are formed in the first region 200N. It is noted that, FIG. 9 is a fragmentary cross-sectional view of the workpiece 200 and thus only shows a portion of the workpiece 200. In embodiments represented in FIG. 9, the fragmentary cross-sectional view of the workpiece 200, an isolation structure 224A is formed on one side of the fin-shaped structure 210*a* and an isolation structure 224B is formed on the other side of the fin-shaped structure 210*a*. The isolation structure 224A may be substantially symmetric to the isolation structure 224B. Each of the isolation structures 224A and 224B includes a base region 224*c* having a substantially uniform thickness T2 in the Z direction and a smiling region 224*d* protruding from the base region 224*c*. The thickness T2 is substantially equal to the thickness T1. Top surfaces of the isolation structures 224A and 224B expose both the base region 224*c* and the smiling region 224*d*. That is, a top surface of the isolation structure 224A includes a top surface of the smiling region 224*d* and a top surface of a portion of the base region 224*c* that is not covered by the smiling region 224*d*. The smiling region 224*d* interfaces with the fin-shaped structure 210*a* and a height of the interface 224*i* may be referred to as height H3. Due to the different recipes used in the first etching process 216 and the second etching process 222, the height H3 is greater than the height H2 such that the diffusion path between the mesa structure 205*b* and the mesa structure 205*a* may be substantially blocked. In an embodiment, a ratio of the height H3 to the height H2 (i.e., H3/H2) is between about 2 and about 10. The smiling region 224*b* has a width W2 along the X direction. The width W2 is greater than the width W1. In an embodiment, a ratio of the height H3 to the width W2 may be between about 0.9 and 1.1. In some embodiments, the height H3 is between about 1 nm and about 10 nm, and the width W2 is between about 1 nm and about 10 nm. In embodiments represented in FIG. 9, to substantially eliminate or reduce the dopants from being diffused into the mesa structure 205*a*, the interface 224*i* substantially fully covers the mesa structure 205*a* that is not covered by the base region 224*c*. That is, sidewalls of the mesa structure 205*a* are fully covered by the isolation structures 224A and 224B. The isolation structures 224A and 224B may include portions of shallow trench isolation (STI) features. In some embodiments, the smiling region 224*d* and a portion of the base region 224*c* that is directly under the smiling region 224*d* may be collectively referred to as an edge region of the isolation structure, and a rest of the base region 224*c* (i.e., the portion of the base region 224*c* that is not directly under the smiling region 224*d*) may be referred to as a central region.

Figure 10:
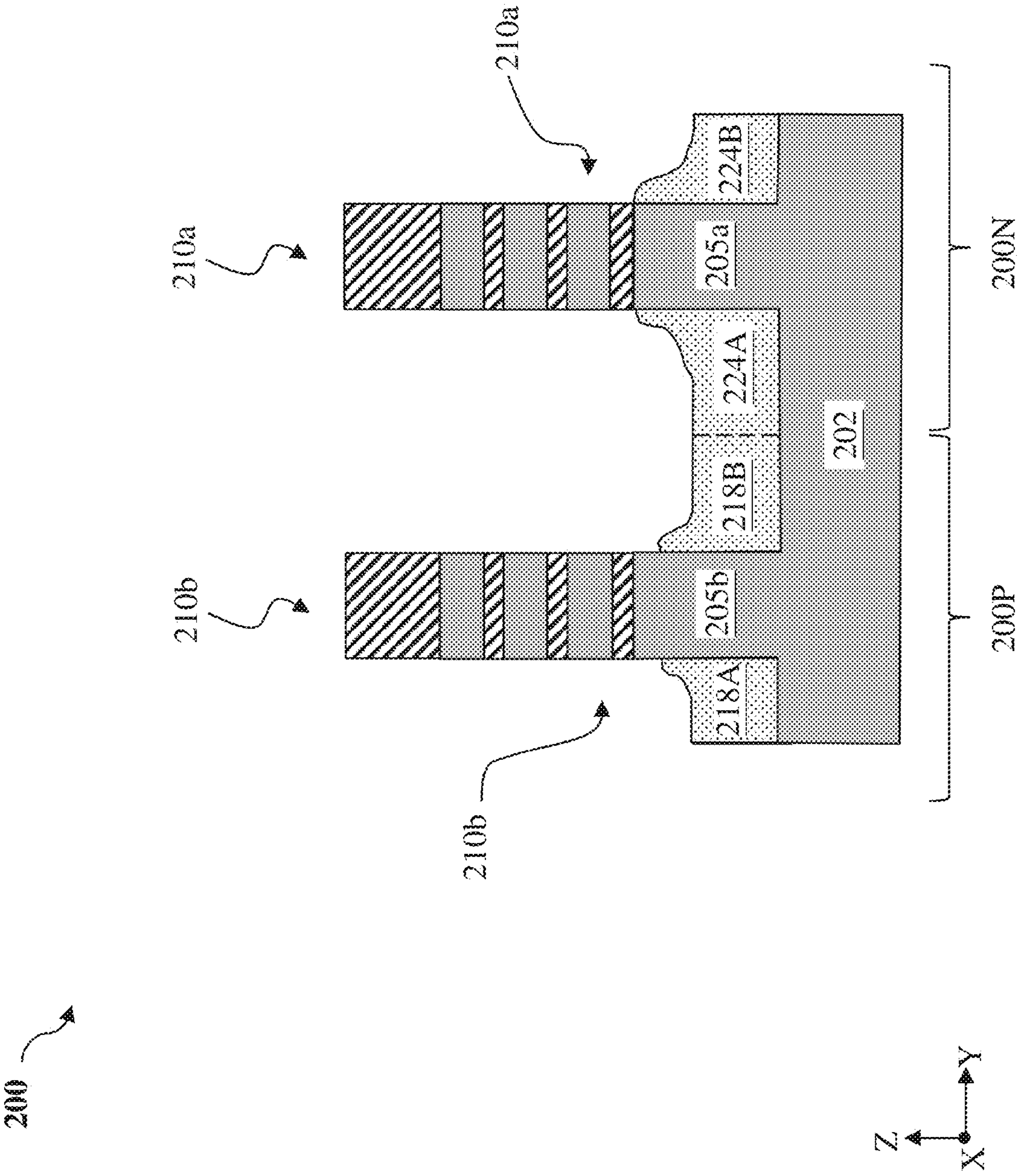

It is understood that FIG. 9 is a fragmentary cross-sectional view of the workpiece 200 and the workpiece 200 also includes another fin-shaped structure 210*a*' (shown in FIG. 4) and another isolation structure 224A that extending from the isolation structure 224B and is in direct contact with the fin-shaped structure 210*a*'. It is noted that, although there is a dashed line shown in FIG. 10 to indicate the boundary between the first region 200N and the second region 200P, the isolation structure 218B and isolation structure 224A are seamlessly in direct contact with each other since there is no interface between the dielectric layer 212*a* and the dielectric layer 212*b*. That is, there is no interface between the isolation structure 218B and isolation structure 224A. As shown in FIG. 10, after the second etching process 222, the second pattern film 220 may be selectively removed.

Figure 11:
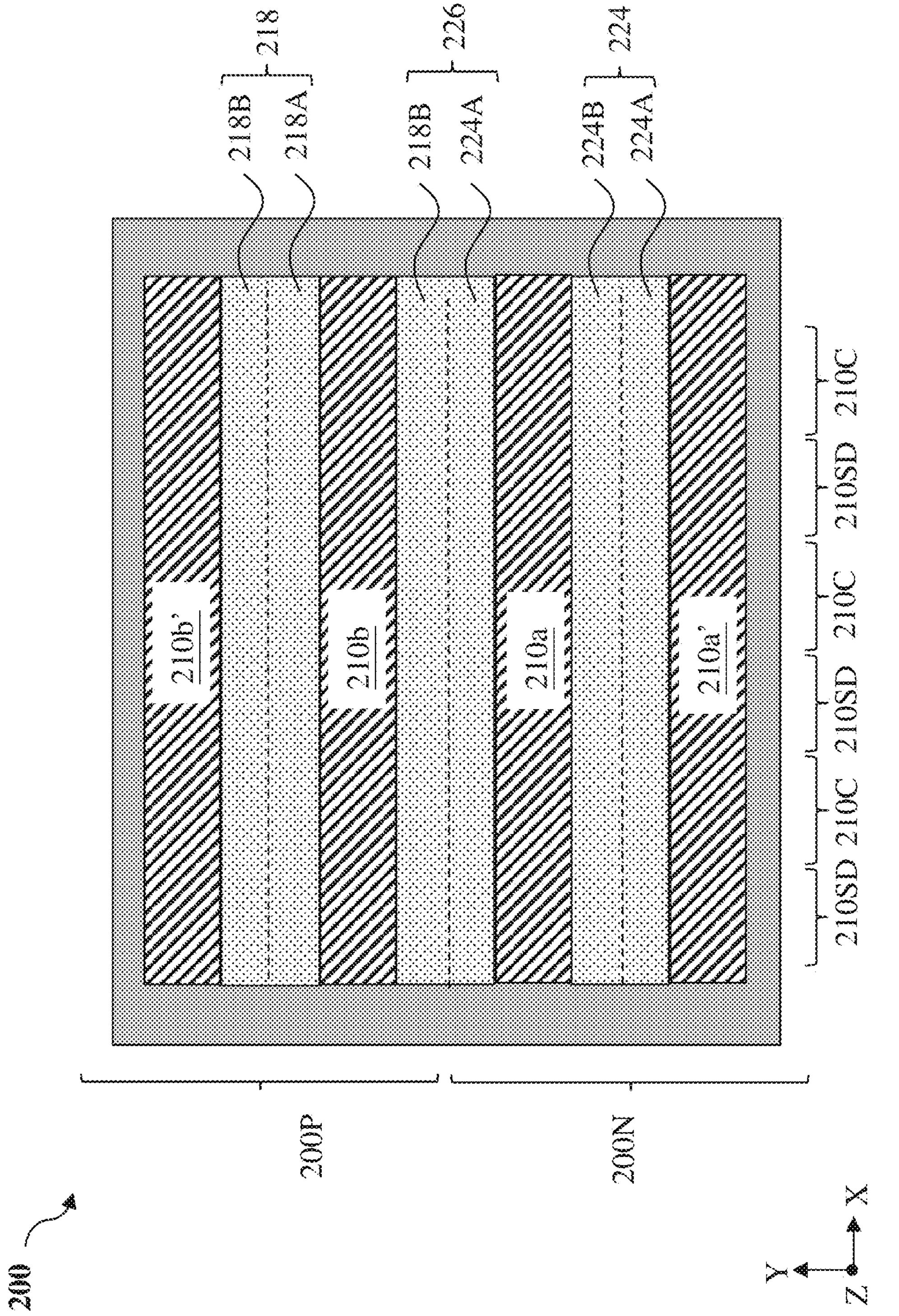

FIG. 11 depicts a fragmentary top view of the workpiece 200 shown in FIG. 10. As shown in FIG. 11, the workpiece 200 includes a number of fin-shaped structures (such as fin-shaped structures 210*a* and 210*a*') in the first region 200N and a number of fin-shaped structures (such as fin-shaped structures 210*b* and 210*b*') in the second region 200P. As exemplary shown in FIG. 11, the fin-shaped structure 210*a*' is spaced apart from the fin-shaped structure 210*a* by both isolation structures 224B and 224A. The isolation structures 224A and 224B may be collectively referred to as an isolation feature 224 as context requires. The isolation feature 224 may include a STI feature. The fin-shaped structure 210*b*' is spaced apart from the fin-shaped structure 210*b* by both isolation structures 218A and 218B. The isolation structures 218A and 218B may be collectively referred to as an isolation feature 218 as context requires. The isolation feature 218 may include a STI feature. The fin-shaped structure 210*b* is spaced apart from the fin-shaped structure 210*a* by both isolation structures 224A and 218B. The isolation structures 224A and 218B may be collectively referred to as an isolation feature 226 as context requires. The isolation feature 226 may include a STI feature. As such, the workpiece 200 include three types of isolation features 218, 224, and 226 with different smiling region profiles (e.g., smiling regions 218*d*, 224*d*, and a combination of smiling regions 218*d* and 224*d*, respectively).

Figure 12:
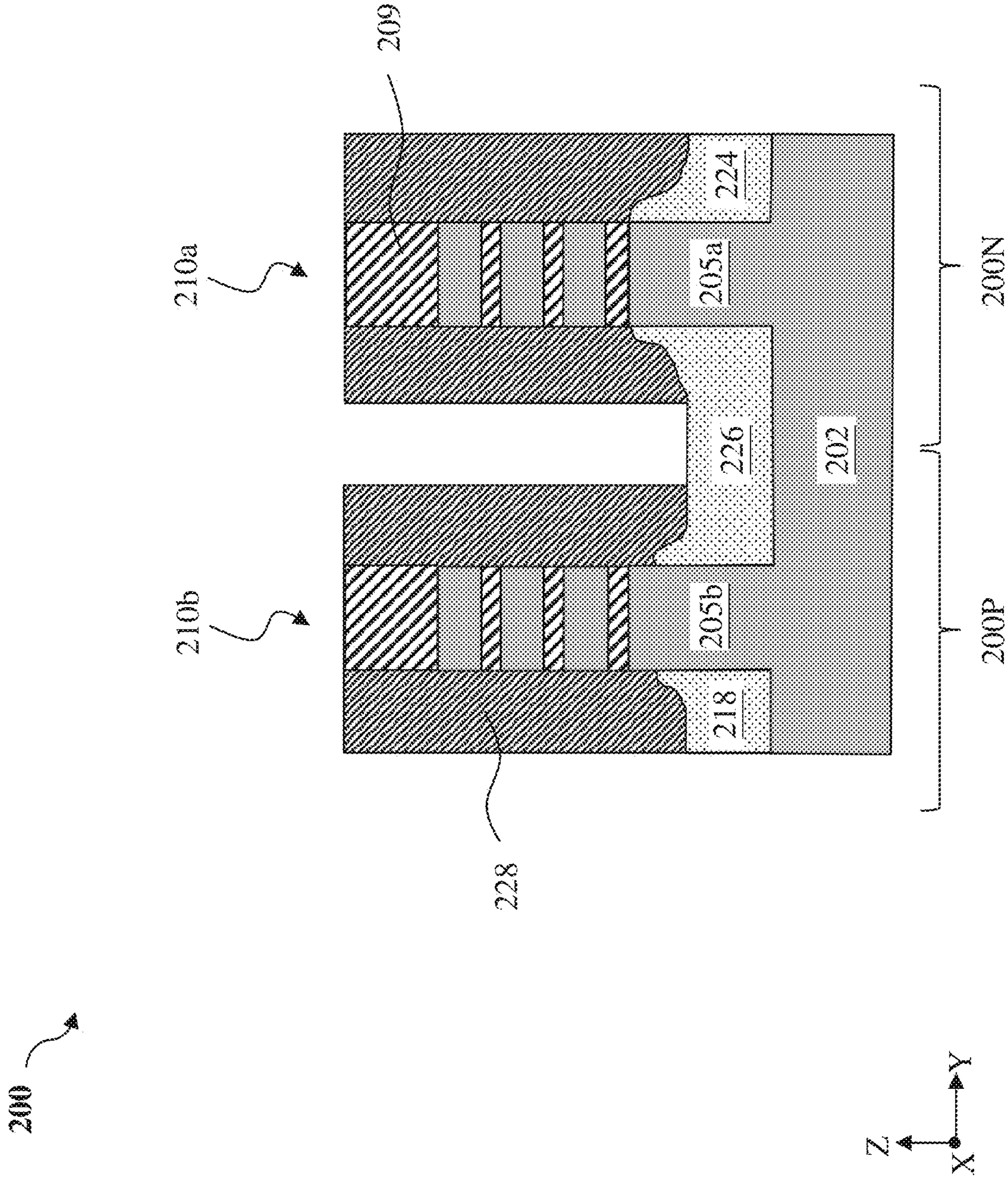

Referring to FIGS. 1 and 12, method 100 includes a block 116 where a cladding layer 228 is formed over the workpiece 200 and extending along sidewall surfaces of each fin-shaped structures such as fin-shaped structures 210*a* and 210*b*. In the present embodiments, the cladding layer 228 may have a composition substantially the same as that of the sacrificial layer 206, such that they may be selectively removed by a common etching process. In the present embodiment, the cladding layer 228 is formed of SiGe. In some embodiments, the cladding layer 228 is deposited conformally over surfaces of the workpiece 200. An anisotropic etching process may be performed to selectively remove portions of the cladding layer 228 that are not extending along sidewalls of the fin-shaped structures 210*a* and 210*b*, thereby exposing portions of the isolation feature 226 and a top surface of the hard mask layer 209. In some embodiments, to further improve the performance of the workpiece 200, the cladding layer 228 is formed to cover the smiling regions of the isolation features 218, 224, and 226, as illustrated in FIG. 12.

Figure 13:
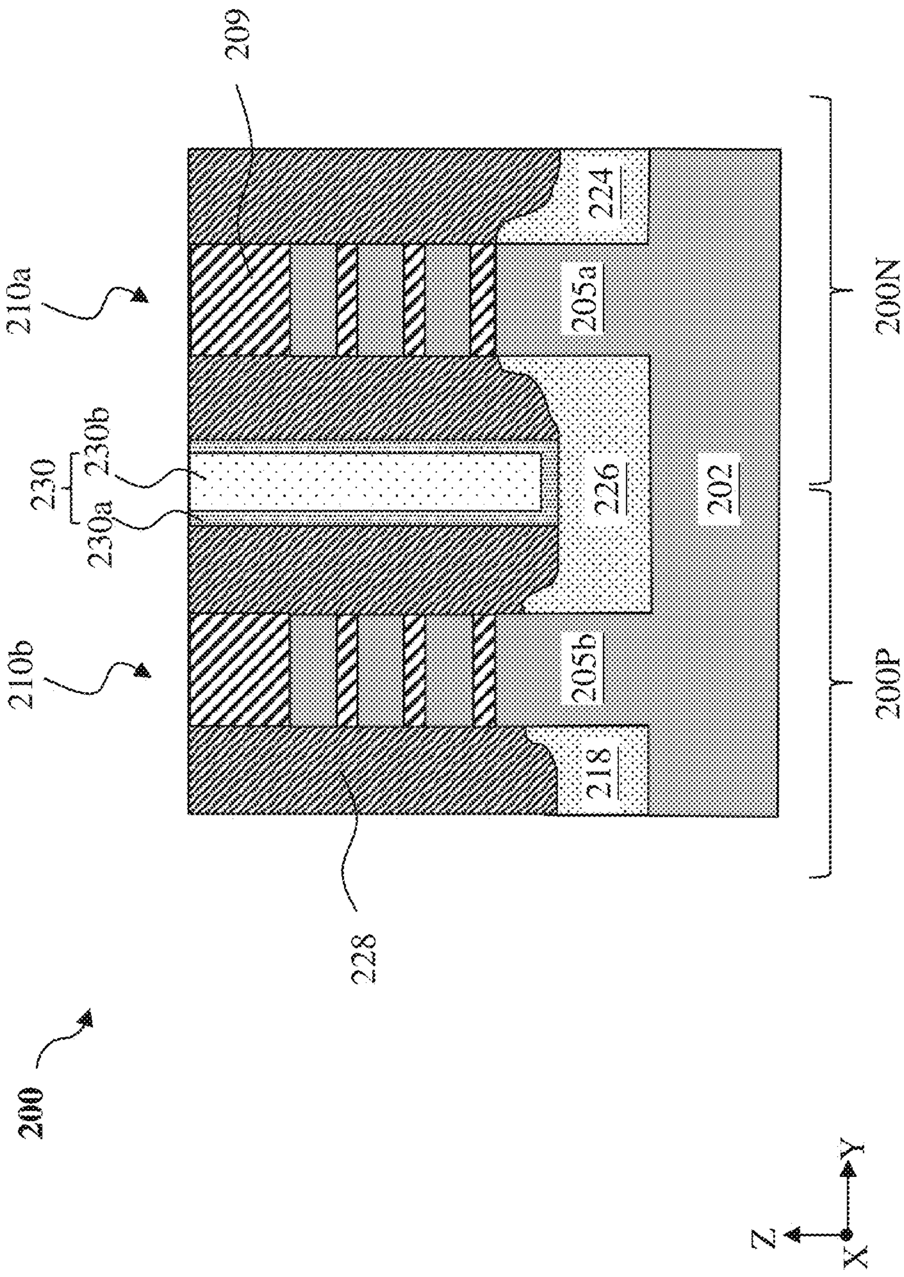
Figure 14:
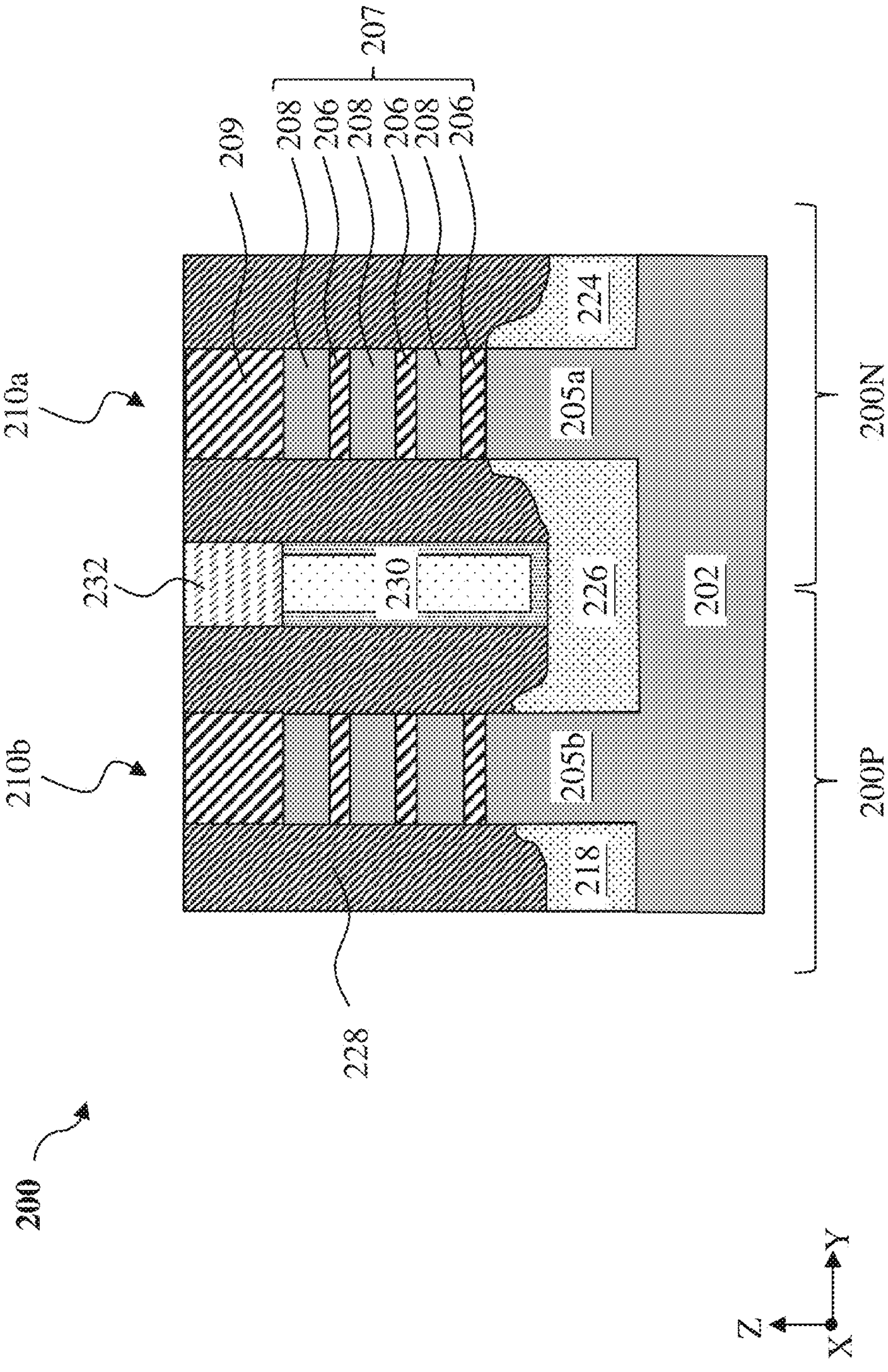

Referring to FIGS. 1 and 13-14, method 100 includes a block 116 where a dielectric fin 230 is formed between two adjacent cladding layers 228. In some embodiments, the dielectric fin 230 may be a multi-layer structure. For example, as shown in FIG. 13, the dielectric fin 230 includes a first film 230*a* and a second film 230*b* embedded in the first film 230*a*. A top surface of the dielectric fin 230 exposes both the first film 230*a* and the second film 230*b*. The second film 230*b* is spaced apart from the isolation features (e.g., isolation feature 226) and the cladding layers 228 by the first film 230*a*. In some embodiments, the first film 230*a* may be formed by performing a deposition process such as a CVD process, a physical vapor deposition (PVD) process, an atomic layer deposition (ALD) process, or other suitable deposition process and may include silicon nitride, silicon carbonitride (SiCN), silicon oxycarbonitride (SiOCN), or other suitable materials. In some embodiments, the second film 230*b* may be deposited over the workpiece 200 using chemical vapor deposition (CVD), flowable chemical vapor deposition (FCVD), ALD, spin-on coating, and/or other suitable process and may include silicon oxide, silicon carbide, FSG, or other suitable dielectric material. After the deposition of the second film 230*b*, a planarization process, such as a chemical mechanical polishing (CMP) process, may be performed to planarize the workpiece 200 to remove excess materials and expose a top surface of the hard mask layer 209.

After forming the dielectric fin 230, as shown in FIG. 14, the dielectric fin 230 is selectively recessed and a helmet layer 232 is then formed on the recessed dielectric fin 230. As shown in FIG. 14, a bottom surface of the helmet layer 232 is substantially co-planar with the top surface of the topmost channel layer 208. In other words, a top surface of the recessed dielectric fin 230 is substantially coplanar with top surfaces of the patterned stacks 207 of the fin-shaped structures 210*a*-210*b*. The helmet layer 232 is separated from the sidewalls of the fin-shaped structures 210*a*-210*b* by the cladding layer 228. The helmet layer 232 may be a high-k dielectric layer and may include aluminum oxide, aluminum nitride, aluminum oxynitride, zirconium oxide, zirconium nitride, zirconium aluminum oxide, hafnium oxide, other high-k material, or a suitable dielectric material. The helmet layer 232 may be deposited by a CVD process, an ALD process, a PVD process, and/or other suitable process. The workpiece 200 is then planarized using a CMP process to remove excess helmet layer 232 on the hard mask layer 209. In the present embodiment, the helmet layer 232 is configured to isolate two adjacent gate structures (e.g., gate structures 250N and 250P, shown in FIG. 18). The helmet layer 232 may be referred to as a gate isolation feature or a gate cut feature.

Figure 15:
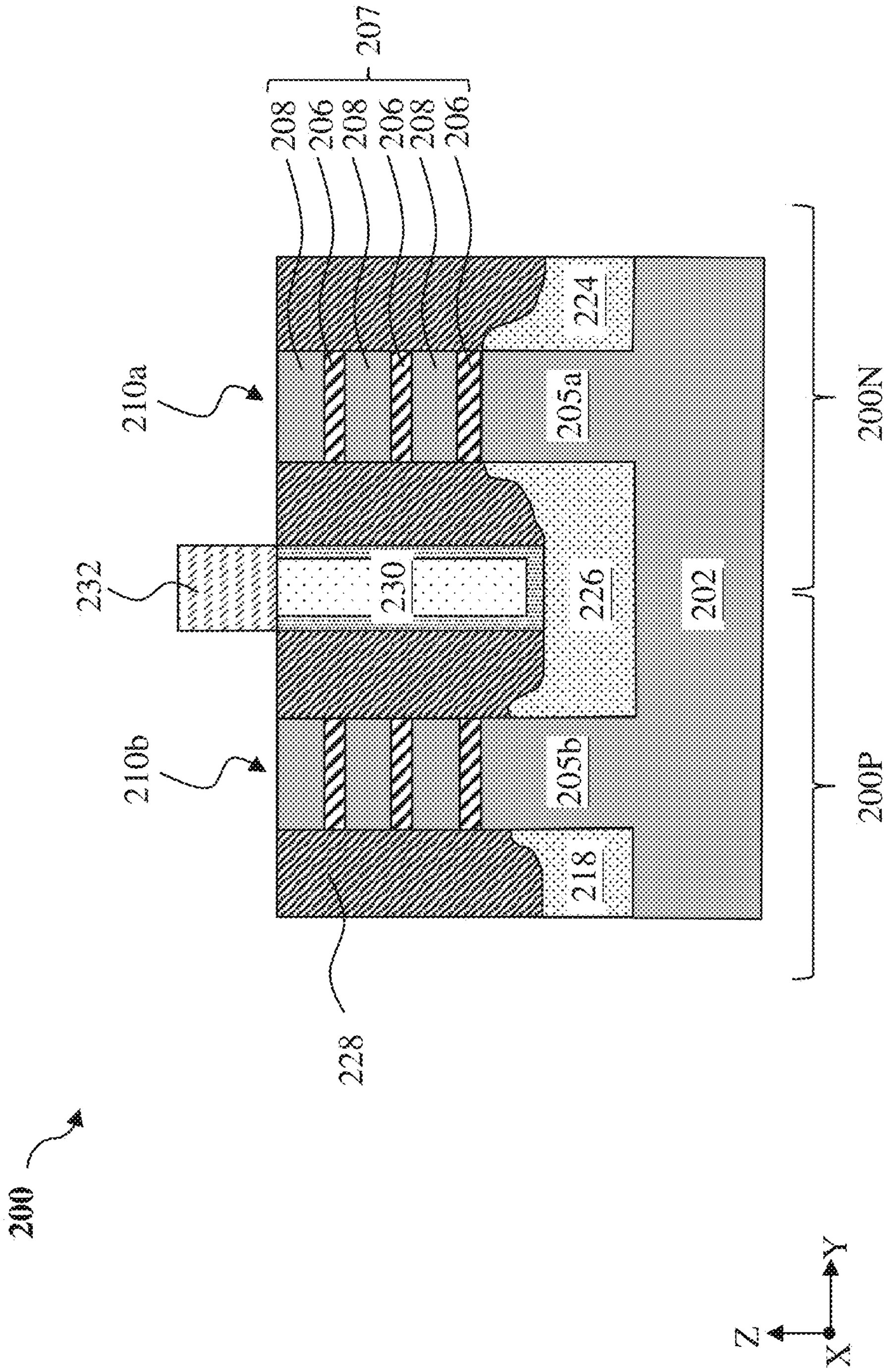
Figure 16:
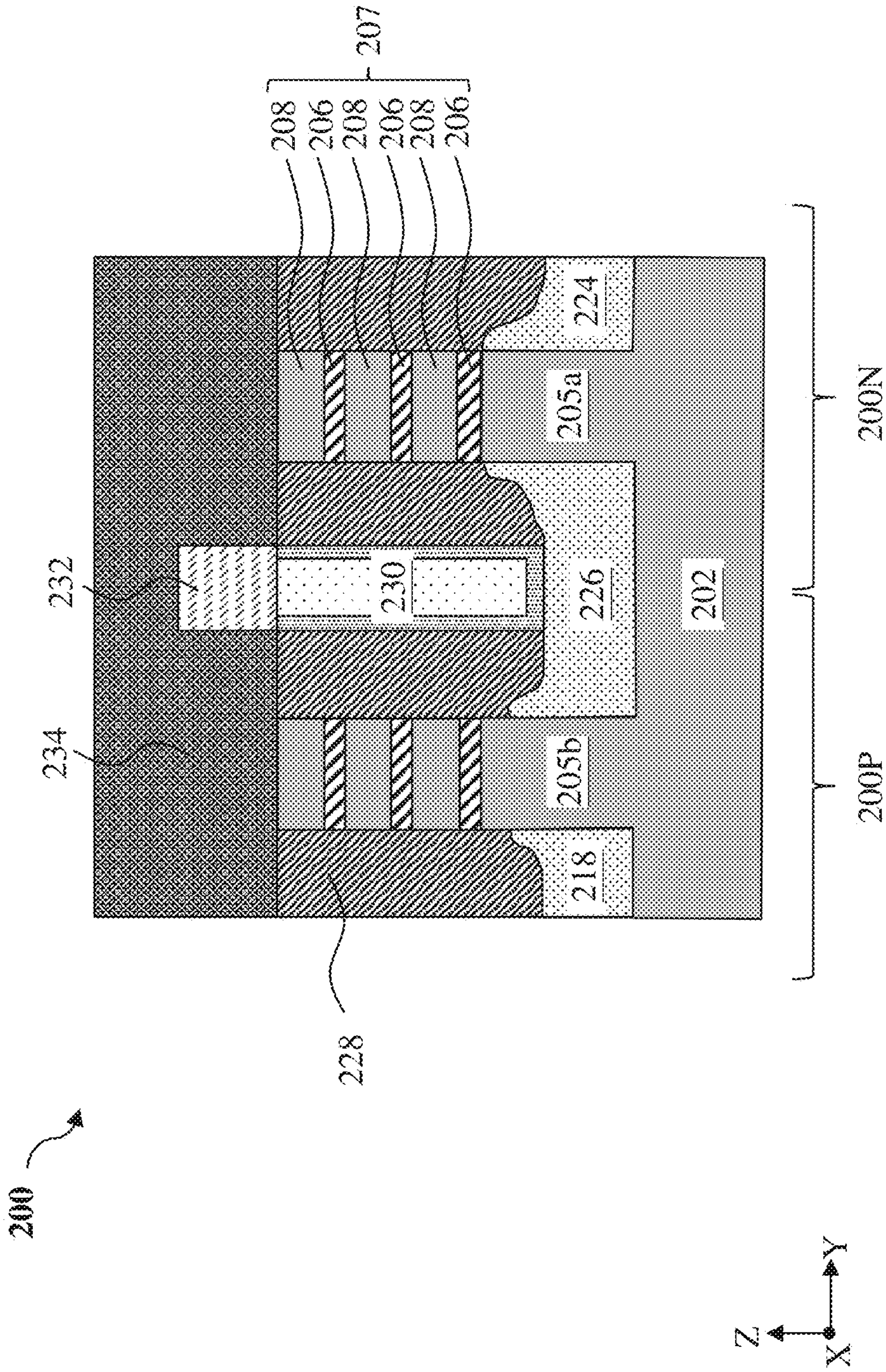
Figure 17:
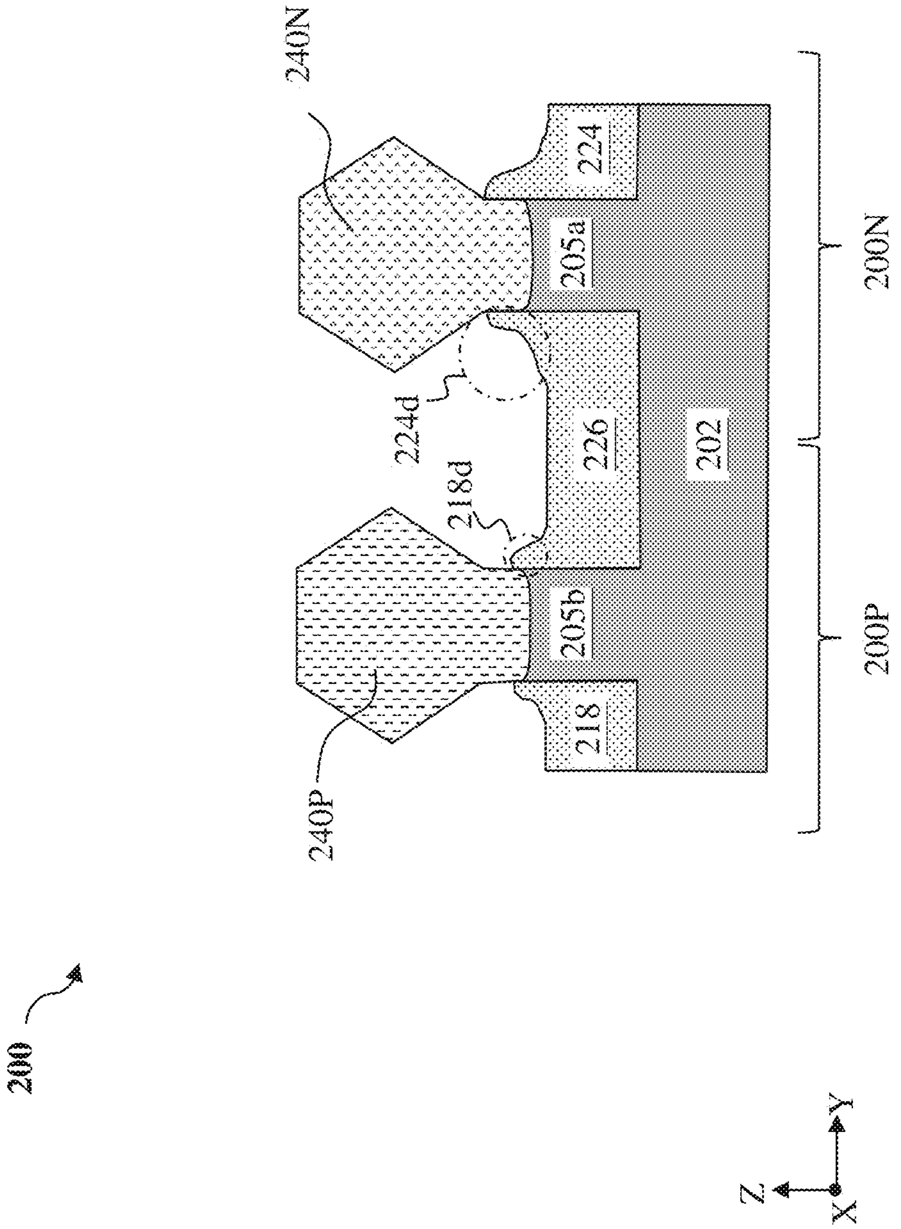

Referring to FIGS. 1 and 15-16, method 100 includes a block 120 where a dummy gate stack 234 is formed over the workpiece 200. As shown in FIG. 15, after forming the helmet layer 232, the workpiece 200 is etched to selectively remove the hard mask layer 209 and a portion of the cladding layer 228 that extends along the sidewalls of the hard mask layer 209 without substantially etching the helmet layer 232 or the topmost channel layers 208. In some implementations, the etching process employed in block 120 may include a selective dry etching process. In some implementations, the etching process may include a selective wet etching process (e.g., selective to SiGe) that includes ammonium hydroxide ($NH_4OH$), hydrogen fluoride (HF), hydrogen peroxide ($H_2O_2$), or a combination thereof. After the etching process, the cladding layers 228 and the topmost channel layers 208 are substantially coplanar.

As shown in FIG. 16, a dummy gate stack 234 is then formed over channel regions 210C of the fin-shaped structures 210*a*-210*b*. In this embodiment, a gate replacement process (or gate-last process) is adopted where the dummy gate stack 234 serves as a placeholder for a functional gate structure. Other processes and configurations are possible. While not explicitly shown, the dummy gate stack 234 may include a dummy dielectric layer and a dummy electrode disposed over the dummy dielectric layer. In some embodiments, the dummy dielectric layer may include silicon oxide and the dummy electrode may include polycrystalline silicon (polysilicon). After the dummy gate stack 234 is formed, a gate spacer (not shown) may be formed along sidewalls of the dummy gate stack 234. Dielectric materials for the gate spacer may be selected to allow selective removal of the dummy gate stack 234 without substantially damaging the gate spacer. The gate spacer may include silicon nitride, silicon oxycarbonitride, silicon carbonitride, silicon oxide, silicon oxycarbide, silicon carbide, silicon oxynitride, and/or combinations thereof.

Referring to FIGS. 1 and 17, method 100 includes a block 120 where inner spacer features (not shown) and epitaxial source/drain features are formed in the first region 200N and the second region 200P. With the dummy gate stack 234 and the gate spacer serving as an etch mask, the workpiece 200 is anisotropically etched in the source/drain regions 210SD of the fin-shaped structures 210*a*-210*b* to form source/drain openings (filled by source/drain features). The anisotropic etch in block 120 may include a dry etching process and may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Source/drain openings may not only extend through the stack 207, but also extend through a portion of the substrate 202. After forming source/drain openings, the sacrificial layers 206 exposed in the source/drain openings are selectively and partially recessed to form inner spacer recesses (filled by inner spacer features, not shown), while the exposed channel layers 208 are substantially unetched. In some embodiments, this selective recess may include a selective isotropic etching process (e.g., a selective dry etching process or a selective wet etching process), and the extent at which the sacrificial layers 206 is recessed is controlled by duration of the etching process. After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features.

Still referring to FIGS. 1 and 17, after forming the inner spacer features, n-type source/drain features 240N are formed in source/drain openings in the first region 200N and p-type source/drain features 240P are formed in source/drain openings in the second region 200P. The n-type source/drain features 240N and the p-type source/drain features 240P each may be epitaxially and selectively formed from exposed top surfaces of the substrate 202 and exposed sidewalls of the channel layers 208 by using an epitaxial process, such as vapor phase epitaxy (VPE), ultrahigh-vacuum chemical vapor deposition (UHV-CVD), molecular-beam epitaxy (MBE), and/or other suitable processes. The n-type source/drain features 240N are coupled to the channel layers 208 in the first region 200N and may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. The p-type source/drain features 240P are coupled to the channel layers 208 in the second region 200P and may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. As shown in FIG. 17, a first portion of the p-type source/drain feature 240P is surrounded by the smiling region 218*d* and a second portion of the n-type source/drain feature 240N is surrounded by the smiling region 224*d*. Since the smiling region 224*d* is higher than the smiling region 218*d*, the first portion is greater than the second portion.

After forming the source/drain features 240N and 240P, further processes may be performed. For example, although not shown, a contact etch stop layer (CESL) and an interlayer dielectric (ILD) layer may be deposited over the workpiece 200. The CESL may include silicon nitride, silicon oxynitride, and/or other suitable materials and may be formed by atomic layer deposition (ALD), plasma-enhanced chemical vapor deposition (PECVD) process and/or other suitable deposition or oxidation processes. The CESL may be deposited on top surfaces of the source/drain features 240N-240P and sidewalls of the gate spacer. The ILD layer is deposited by a PECVD process or other suitable deposition technique over the workpiece 200 after the deposition of the CESL. The ILD layer may include materials similar to that of the dielectric layer 212.

Figure 18:
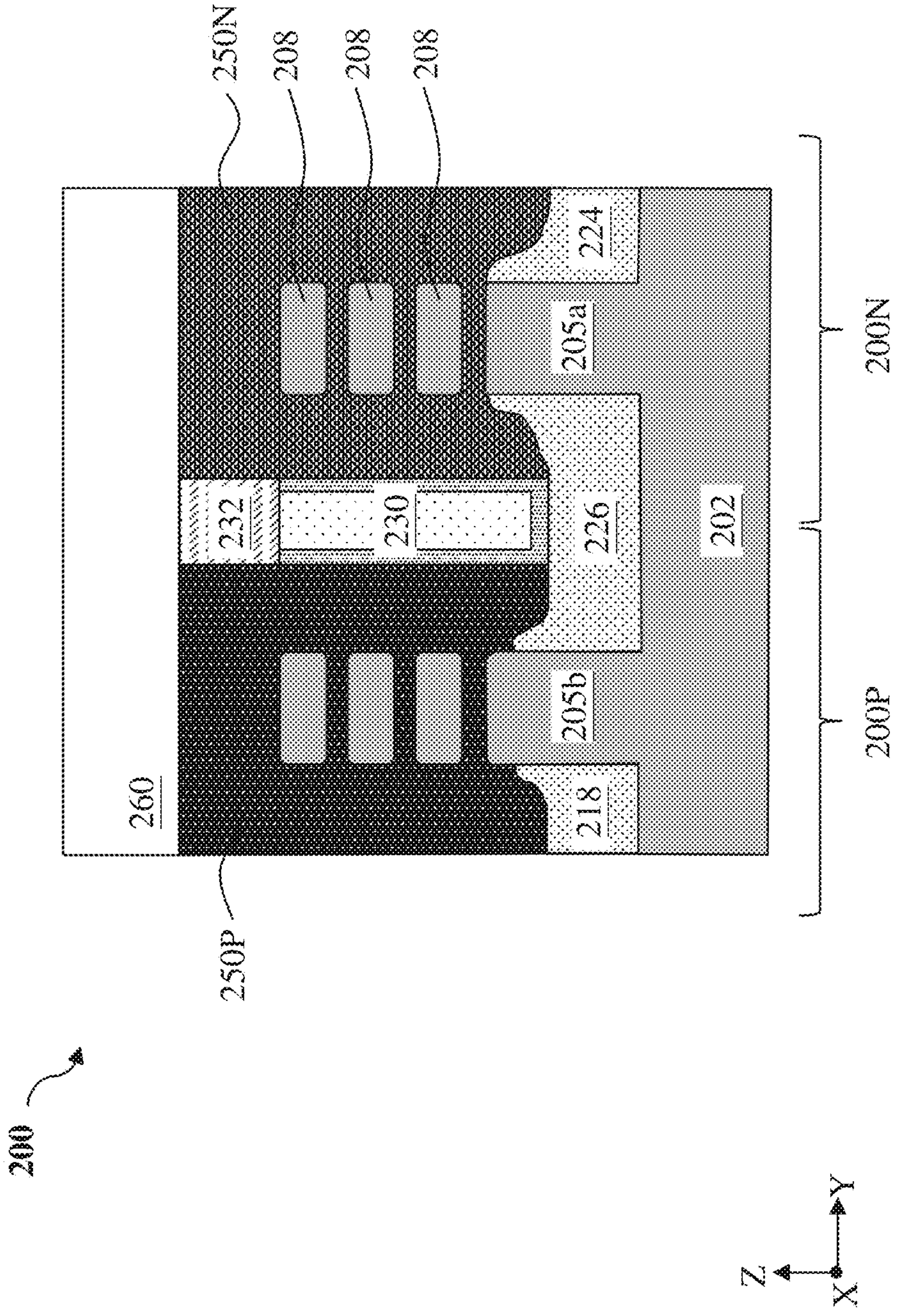

Referring to FIGS. 1 and 18, method 100 includes a block 120 where the dummy gate stack 234 is replaced by functional gate structures. For example, an etching process may be performed to selectively remove the dummy gate stack 234 without substantially removing the helmet layer 232, the topmost channel layer 208, the gate spacers, the CESL, or the ILD layer. The etching process may include any suitable process, such as a dry etching process, a wet etching process, or combinations thereof. After removal of the dummy gate stack 234, the cladding layer 228 and the topmost channel layer 208 are exposed. Another etching process may be then followed to selectively remove the sacrificial layers 206 without substantially removing the channel layers 208. In the present embodiments, the etching process in this channel release process also removes the cladding layer 228, which has a composition similar to or the same as that of the sacrificial layers 206. In some embodiments, the etching process in this channel release process includes in a series of etching processes such as selective dry etching, selective wet etching, or other selective etching processes. In one example, a wet etching process that employs an oxidant such as ammonium hydroxide ($NH_4OH$), ozone ($O_3$), nitric acid ($HNO_3$), hydrogen peroxide ($H_2O_2$), other suitable oxidants, and a fluorine-based etchant such as hydrofluoric acid (HF), ammonium fluoride ($NH_4F$), other suitable etchants, or combinations thereof may be performed to selectively remove the sacrificial layers 206 and the cladding layer 228.

After the channel release process, a gate structure 250N is formed over the workpiece 200 to wrap around each of the channel members 208 in the first region 200N and a gate structure 250P is formed over the workpiece 200 to wrap around each of the channel members 208 in the second region 200P. Each of the gate structure 250N and gate structure 250P may include an interfacial layer. In some embodiments, the interfacial layer may include silicon oxide. A gate dielectric layer is then deposited over the interfacial layer using ALD, CVD, and/or other suitable methods. The gate dielectric layer may include high-k dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide, zirconium silicon oxide ($ZrSiO_2$), lanthanum oxide ($La_2O_3$), aluminum oxide ($Al_2O_3$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), (Ba,Sr)$TiO_3$ (BST), silicon nitride (SiN), silicon oxynitride (SiON), combinations thereof, or other suitable material. A gate electrode layer is then deposited over the gate dielectric layer. The gate electrode layer may be a multi-layer structure that includes at least one work function layer and a metal fill layer. By way of example, the gate stack 450N may include an n-type work function metal layer such as Ti, Al, Ag, Mn, Zr, TiAl, TiAlC, TaC, TaCN, TaSiN, TaAl, TaAlC, TiAlN, other n-type work function material, or combinations thereof, and the gate stack 450P may include a p-type function metal layer such as TiN, TaN, Ru, Mo, Al, WN, $ZrSi_2$, $MoSi_2$, $TaSi_2$, $NiSi_2$, WCN, other p-type work function material, or combinations thereof. In various embodiments, a planarization process, such as a CMP process, may be performed to remove excess materials until the helmet layer 232 is exposed.

Referring to FIGS. 1 and 18, method 100 includes a block 124 where further processes may be performed to complete the fabrication of the semiconductor device 200. For example, method 100 may further include recessing the gate structure 250N and gate structure 250P, forming dielectric capping layer over the recessed gate structure 250N and the recessed gate structure 250P. Such further processes may also include forming an interconnect structure 260 configured to connect the various features to form a functional circuit that includes the different semiconductor devices. The interconnect structure 260 may include multiple interlayer dielectric (ILD) layers and multiple metal lines, contact vias, and/or power rails in each of the ILD layers. The metal lines, contact vias, and/or power rails in each ILD layer may be formed of metal, such as aluminum, tungsten, ruthenium, or copper.

Figure 19:
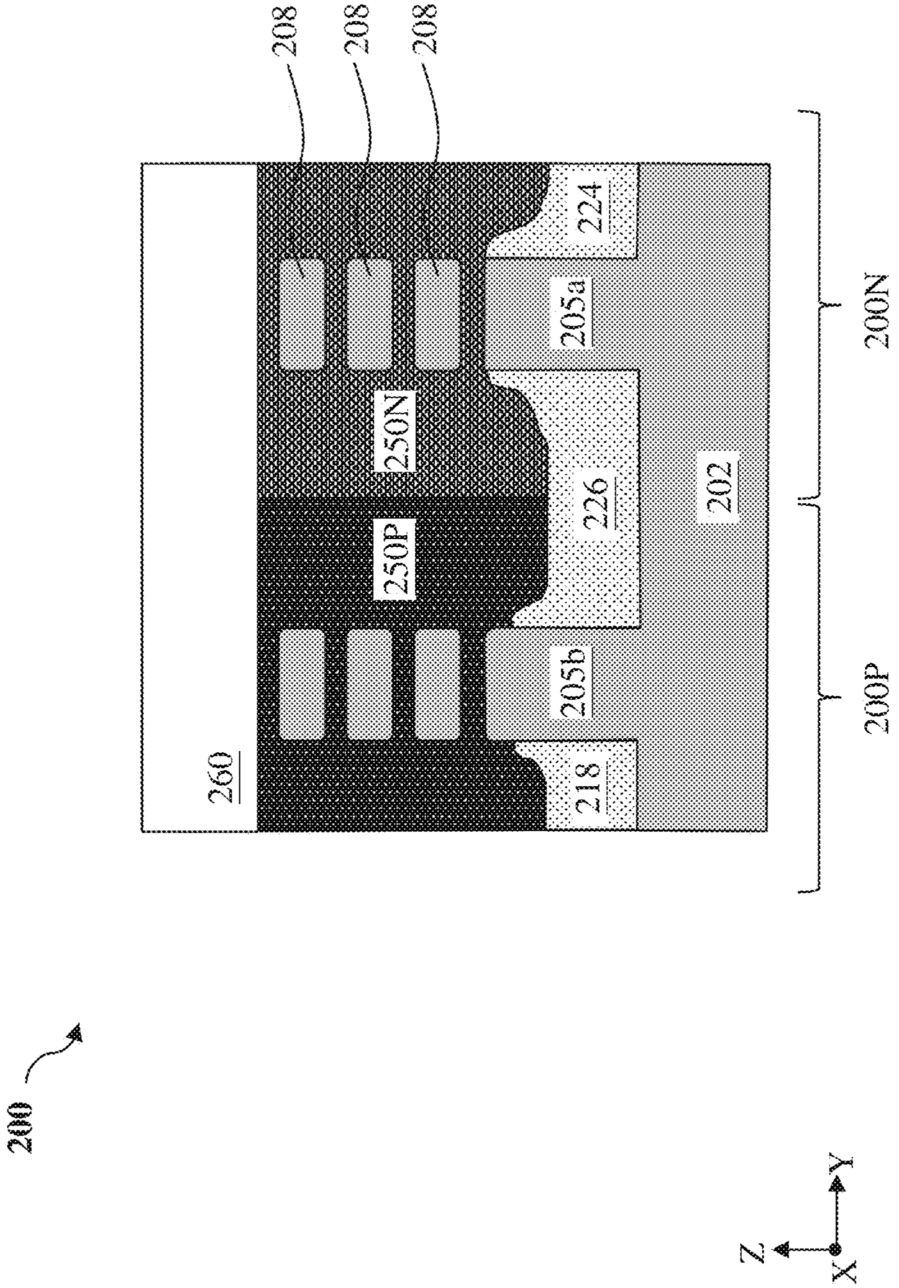

In the above embodiments, the gate structure 250N is spaced apart from the gate structure 250P by the dielectric fin 230 and the helmet layer 232. In some other implementations, to form different circuits and fulfill different functions, as shown in FIG. 19, the gate structure 250N may be electrically coupled to and in direct contact with the gate structure 250P. In such a situation, the formation of the dielectric fin 230 and the helmet layer 232 may be omitted.

Although not intended to be limiting, one or more embodiments of the present disclosure provide many benefits to a semiconductor device and the formation thereof. For example, the present disclosure provides a semiconductor device having different isolation structures for n-type devices and p-type devices (e.g., GAA transistors). More specifically, the isolation structures for n-type GAA transistors include smiling regions having a height greater than a height of smiling regions of isolation structures for p-type GAA transistors. Thus, current leakage of the n-type GAA transistors may be reduced, leading to improved device performance. Embodiments of the disclosed methods can be readily integrated into existing processes and technologies for manufacturing GAA FETs.

The present disclosure provides for many different embodiments. Semiconductor structures and methods of fabrication thereof are disclosed herein. In one exemplary aspect, the present disclosure is directed to a method. The method includes receiving a workpiece that includes a first portion including a first active region protruding from a substrate, and a second portion including a second active region protruding from the substrate. The method also include depositing a dielectric layer over the workpiece to fill a trench between the first active region and the second active region and recessing the dielectric layer to form an isolation feature in the trench, the isolation feature comprising a first edge region surrounding a bottom portion of the first active region, a second edge region surrounding a bottom portion of the second active region, and a central region having a substantially planar top surface and extending between the first edge region and the second edge region. A height of the first edge region is smaller than a height of the second edge region.

In some embodiments, the recessing of the dielectric layer to form the isolation feature in the trench may include forming a first pattern film over the second portion of the workpiece, performing a first etching process to recess a portion of the dielectric layer exposed by the first pattern film to form the first edge region and a portion of the central region of the isolation feature in the first portion of the workpiece, forming a second pattern film over the first portion of the workpiece, and performing a second etching process to recess another portion of the dielectric layer exposed by the second pattern film to form the second edge region and a rest of the central region of the isolation feature in the second portion of the workpiece. In some embodiments, an etchant of the first etching process may be same as an etchant of the second etching process. In some embodiments, the first etching process is performed in a process chamber at a first pressure, the second etching process may be performed in the process chamber at a second pressure different than the first pressure. In some embodiments, a width of the second edge region may be greater than a width of the first edge region. In some embodiments, the method may also include recessing source/drain regions of the first active region to form first source/drain openings, recessing source/drain regions of the second active region to form second source/drain openings, and forming p-type source/drain features in the first source/drain openings and n-type source/drain features in the second source/drain openings. In some embodiments, the second edge region may surround portions of the n-type source/drain features. In some embodiments, a thickness of the first edge region may be greater than a thickness of the central region. In some embodiments, the first active region and the second active region each may include a vertical stack of semiconductor layers and a portion of the substrate directly under the vertical stack of semiconductor layers, the vertical stack of semiconductor layers may include a plurality of alternating channel layers and sacrificial layers. In some embodiments, the method may also include selectively removing the sacrificial layers, forming a first metal gate structure wrapping around channel layers in the first active region, and forming a second metal gate structure wrapping around channel layers in the second active region, where a composition of a work function layer in the first metal gate structure may be different than a composition of a work function layer in the second metal gate structure.

In another exemplary aspect, the present disclosure is directed to a method. The method includes receiving a workpiece comprising a vertical stack of alternating first semiconductor layers and second semiconductor layers over a substrate, patterning the vertical stack and a portion of the substrate to form a first fin-shaped structure and a second fin-shaped structure, where the first fin-shaped structure includes a first portion of the vertical stack and a first mesa structure directly under the first portion of the vertical stack, the second fin-shaped structure comprising a second portion of the vertical stack and a second mesa structure directly under the second portion of the vertical stack. The method also includes depositing a dielectric layer over workpiece to fill a trench between the first fin-shaped structure and the second fin-shaped structure, recessing a first portion of the dielectric layer to form a first isolation feature surrounding a bottom portion of the first fin-shaped structure, and recessing a second portion of the dielectric layer to form a second isolation feature surrounding a bottom portion of the second fin-shaped structure, where a height of the second isolation feature is greater than a height of the first isolation feature.

In some embodiments, the second isolation feature may substantially cover a sidewall surface of the second mesa structure. In some embodiments, the recessing of the first portion of the dielectric layer may include performing a first etching process in a process chamber at a first pressure, the recessing of the second portion of the dielectric layer comprises performing a second etching process in the process chamber at a second pressure, where the first pressure may be different than the second pressure. In some embodiments, a ratio of the height of the second isolation feature to the height of the first isolation feature may be between about 2 and about 10. In some embodiments, the method may also include forming p-type source/drain features over source/drain regions of the first fin-shaped structure, and forming n-type source/drain features over source/drain regions of the second fin-shaped structure, where the second isolation feature may surround a portion of a sidewall surface of one of the n-type source/drain features. In some embodiments, the method may also include selectively removing the first semiconductor layers in the first fin-shaped structure and the second fin-shaped structure to release the second semiconductor layers as first channel members over the first mesa structure and second channel members over the second mesa structure, respectively, and forming a first metal gate structure wrapping around each of the first channel members and a second metal gate structure wrapping around each of the second channel members.

In yet another exemplary aspect, the present disclosure is directed to a semiconductor structure. The semiconductor structure includes a substrate including a first mesa structure and a second mesa structure protruding from the substrate, an isolation structure extending between the first mesa structure and the second mesa structure. The isolation structure includes a first edge portion in direct contact with the first mesa structure and a second edge portion in direct contact with the second mesa structure. The semiconductor structure also includes a first vertical stack of nanostructures directly over the first mesa structure, a second vertical stack of nanostructures directly over the second mesa structure, n-type source/drain features coupled to the first vertical stack of nanostructures, p-type source/drain features coupled to the second vertical stack of nanostructures, a first gate structure wrapping around each nanostructure of the first vertical stack of nanostructures, and a second gate structure wrapping around each nanostructure of the second vertical stack of nanostructures, where a thickness of the first edge portion is greater than a thickness of the second edge portion.

In some embodiments, the first edge portion may partially surround the n-type source/drain features. In some embodiment, the thickness of the first edge portion may be substantially equal to a thickness of the first mesa structure. In some embodiment, a ratio of the thickness of the first edge portion to the thickness of the second edge portion may be between about 2 and about 10.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a workpiece comprising:

a first portion including a first active region protruding from a substrate, and a second portion including a second active region protruding from the substrate;

depositing a dielectric layer over the workpiece to fill a trench between the first active region and the second active region; and recessing the dielectric layer to form an isolation feature in the trench, the isolation feature comprising a first edge region surrounding a bottom portion of the first active region, a second edge region surrounding a bottom portion of the second active region, and a central region extending between the first edge region and the second edge region, wherein a height of the first edge region and a height of the second edge region are greater than a thickness of the central region, a width of the second edge region is greater than a width of the first edge region, and a distance between a top surface of the first edge region and a top surface of the central region is different from a distance between a top surface of the second edge region and the top surface of the central region.

2. The method of claim 1, wherein the recessing of the dielectric layer to form the isolation feature in the trench comprises:

forming a first pattern film over the second portion of the workpiece;

performing a first etching process to recess a portion of the dielectric layer exposed by the first pattern film to form the first edge region and a portion of the central region of the isolation feature in the first portion of the workpiece;

forming a second pattern film over the first portion of the workpiece; and performing a second etching process to recess another portion of the dielectric layer exposed by the second pattern film to form the second edge region and a rest of the central region of the isolation feature in the second portion of the workpiece.

3. The method of claim 2, wherein an etchant of the first etching process is same as an etchant of the second etching process.

4. The method of claim 2, wherein the first etching process is performed in a process chamber at a first pressure, the second etching process is performed in the process chamber at a second pressure different than the first pressure.

5. The method of claim 1, further comprising:
recessing source/drain regions of the first active region to form first source/drain openings;
recessing source/drain regions of the second active region to form second source/drain openings; and
forming p-type source/drain features in the first source/drain openings and n-type source/drain features in the second source/drain openings.

6. The method of claim 5, wherein the second edge region surrounds portions of the n-type source/drain features.

7. The method of claim 1, wherein the first active region and the second active region each include a vertical stack of semiconductor layers and a portion of the substrate directly under the vertical stack of semiconductor layers, the vertical stack of semiconductor layers comprising a plurality of alternating channel layers and sacrificial layers.

8. The method of claim 7, further comprising:
selectively removing the sacrificial layers;
forming a first metal gate structure wrapping around channel layers in the first active region; and
forming a second metal gate structure wrapping around channel layers in the second active region, wherein a composition of a work function layer in the first metal gate structure is different than a composition of a work function layer in the second metal gate structure.

9. The method of claim 1, wherein the height of the first edge region is less than the height of the second edge region.

10. The method of claim 1, wherein the first edge region and the second edge region are formed in a sequential order.

11. A method, comprising:
receiving a workpiece comprising a vertical stack of alternating first semiconductor layers and second semiconductor layers over a substrate;
patterning the vertical stack and a portion of the substrate to form a first fin-shaped structure and a second fin-shaped structure, the first fin-shaped structure comprising a first portion of the vertical stack and a first mesa structure directly under the first portion of the vertical stack, the second fin-shaped structure comprising a second portion of the vertical stack and a second mesa structure directly under the second portion of the vertical stack;
depositing a dielectric layer over the workpiece to fill a trench between the first fin-shaped structure and the second fin-shaped structure;
recessing a first portion of the dielectric layer to form a first isolation feature surrounding a bottom portion of the first fin-shaped structure; and
recessing a second portion of the dielectric layer to form a second isolation feature surrounding a bottom portion of the second fin-shaped structure,
wherein a height of the second isolation feature is greater than a height of the first isolation feature.

12. The method of claim 11, wherein the second isolation feature substantially fully covers a sidewall surface of the second mesa structure.

13. The method of claim 11,
wherein the recessing of the first portion of the dielectric layer comprises performing a first etching process in a process chamber at a first pressure, the recessing of the second portion of the dielectric layer comprises performing a second etching process in the process chamber at a second pressure, and
wherein the first pressure is different than the second pressure.

14. The method of claim 11,
wherein a ratio of the height of the second isolation feature to the height of the first isolation feature is between about 2 and about 10.

15. The method of claim 11, further comprising:
forming p-type source/drain features over source/drain regions of the first fin-shaped structure; and
forming n-type source/drain features over source/drain regions of the second fin-shaped structure,
wherein the second isolation feature surrounds a portion of a sidewall surface of one of the n-type source/drain features.

16. The method of claim 11, further comprising:
selectively removing the first semiconductor layers in the first fin-shaped structure and the second fin-shaped structure to release the second semiconductor layers as first channel members over the first mesa structure and second channel members over the second mesa structure, respectively; and
forming a first metal gate structure wrapping around each of the first channel members and a second metal gate structure wrapping around each of the second channel members.

17. A method, comprising:
forming a first active region including a first base region protruded from a substrate and a first plurality of channel layers over the first base region;
forming a second active region including a second base region protruded from the substrate and a second plurality of channel layers over the second base region; and
forming an isolation feature disposed between the first base region and the second base region, wherein the isolation feature comprises a first portion interfacing a lower portion of a sidewall of the first base region and a second portion interfacing a sidewall of the second base region, wherein a top surface of the first portion of the isolation feature is below a top surface of the second portion of the isolation feature; and
forming a gate structure over the first active region and the second active region and extending on the isolation feature, wherein the gate structure further extends along an upper portion of the sidewall of the first base region.

18. The method of claim 17, wherein, in a cross-sectional view cut through the first active region, the second active region, and the isolation feature, an entirety of the sidewall of the second base region is covered by the isolation feature.

19. The method of claim 17, further comprising:
forming a p-type source/drain feature over a source/drain region of the first active region; and
forming an n-type source/drain feature over a source/drain region of the second active region.

20. The method of claim 17, wherein the isolation feature further comprises a third portion extending between the first portion and the third portion, wherein a top surface of the second portion is below the top surface of the first portion and the top surface of the second portion.

* * * * *